United States Patent [19]
Ishibashi et al.

[11] Patent Number: 6,150,690
[45] Date of Patent: *Nov. 21, 2000

[54] STRUCTURE OF A CAPACITOR SECTION OF A DYNAMIC RANDOM-ACCESS MEMORY

[75] Inventors: Yutaka Ishibashi, Kawasaki; Yusuke Kohyama, Yokosuka; Toru Ozaki, Tokyo, all of Japan

[73] Assignee: Kabushiki Kaisha Toshiba, Kawasaki, Japan

[ * ] Notice: This patent issued on a continued prosecution application filed under 37 CFR 1.53(d), and is subject to the twenty year patent term provisions of 35 U.S.C. 154(a)(2).

[21] Appl. No.: 09/030,072

[22] Filed: Feb. 25, 1998

[30] Foreign Application Priority Data

Feb. 28, 1997 [JP] Japan .................................. 9-046813

[51] Int. Cl.⁷ .................................................. H01L 27/108

[52] U.S. Cl. .............................................. 257/306; 257/309

[58] Field of Search .................................. 257/305, 311, 257/68, 296, 300, 297, 304, 308, 309

[56] References Cited

U.S. PATENT DOCUMENTS

| | | | |
|---|---|---|---|
| 4,646,118 | 2/1987 | Takemae | 357/23.6 |
| 5,021,842 | 6/1991 | Koyanagi | 357/23.6 |
| 5,315,141 | 5/1994 | Kim | 257/308 |
| 5,444,013 | 8/1995 | Akram et al. | 437/60 |
| 5,444,278 | 8/1995 | Katayama | 257/296 |
| 5,449,934 | 9/1995 | Shono et al. | 257/295 |
| 5,521,407 | 5/1996 | Kohyama et al. | 257/301 |
| 5,604,696 | 2/1997 | Takaishi | 365/149 |
| 5,629,539 | 5/1997 | Aoki et al. | 257/306 |
| 5,662,768 | 9/1997 | Rostoker | 257/301 |
| 5,691,219 | 11/1997 | Kawakubo et al. | 437/52 |
| 5,705,838 | 1/1998 | Jost et al. | 257/296 |
| 5,774,327 | 6/1998 | Park | 361/321.5 |
| 5,939,746 | 8/1999 | Koyama et al. | 257/306 |
| 5,973,347 | 10/1999 | Nagatomo | 257/309 |

FOREIGN PATENT DOCUMENTS 8-139293    5/1996   Japan .

OTHER PUBLICATIONS

Koichi Seki et al; Non–Volatile and Fast Static Memories; An 80ns 1Mb Flash Memory with On–Chip Erase/Erase–Verify Controller; ISSCC 1990 Digest of Technical Papers, pp. 60–61.

"Novel Stacked Capacitor Technology for 1 Gbit DRAMs with CVD–(Ba,Sr)TiO₃ Thin Films on a Thick Storage Node of Ru", A. Yuuki, M. Yamamuka, T. Kakita, T. Horikawa, T. Shibano, N. Hirano, H. Maeda, N. Mikami, K. Ono, H. Ogata, and H. Abe, Semiconductor Research Laboratory, Materials and Electronic Devices Laboratory, ULSI Laboratory, Mitsubishi Electric Corporation, 1995 IEEE, pp. 5.2.1–5.2.4, IEDM 95–115.

"1990 IEEE International Solid–State Circuits Conference Digest of Technical Papers", ISSN 0193–6530, 1990 IEEE International Solid State Circuit Conference, Feb. 1990.

*Primary Examiner*—David Hardy
*Attorney, Agent, or Firm*—Banner & Witcoff, Ltd.

[57] ABSTRACT

Capacitors are formed in the trenches made in an interlayer insulator made of silicon oxide. An insulating film (e.g., a silicon nitride film) is provided on the sides of each trench of the interlayer insulator. A storage electrode made of ruthenium or the like is provided in each trench of the interlayer insulator. A capacitor insulating film made of BSTO or the like is formed on the storage electrode. A plate electrode made of ruthenium or the like is formed on the capacitor insulating film. The plate electrode is common to all capacitors provided. Any two adjacent capacitors are electrically isolated by the interlayer insulator and the insulating film provided on the sides of the trenches of the interlayer insulator.

33 Claims, 21 Drawing Sheets

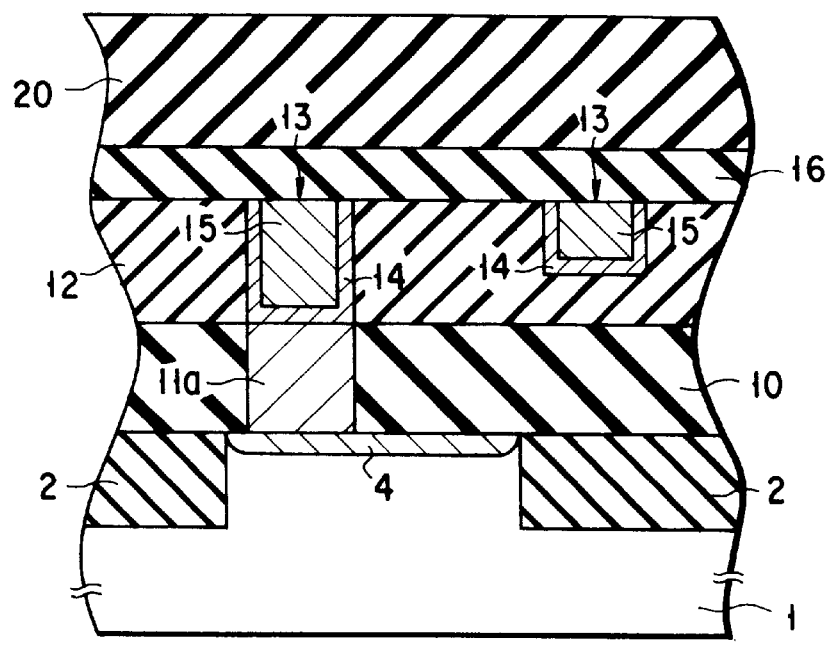
F I G. 6
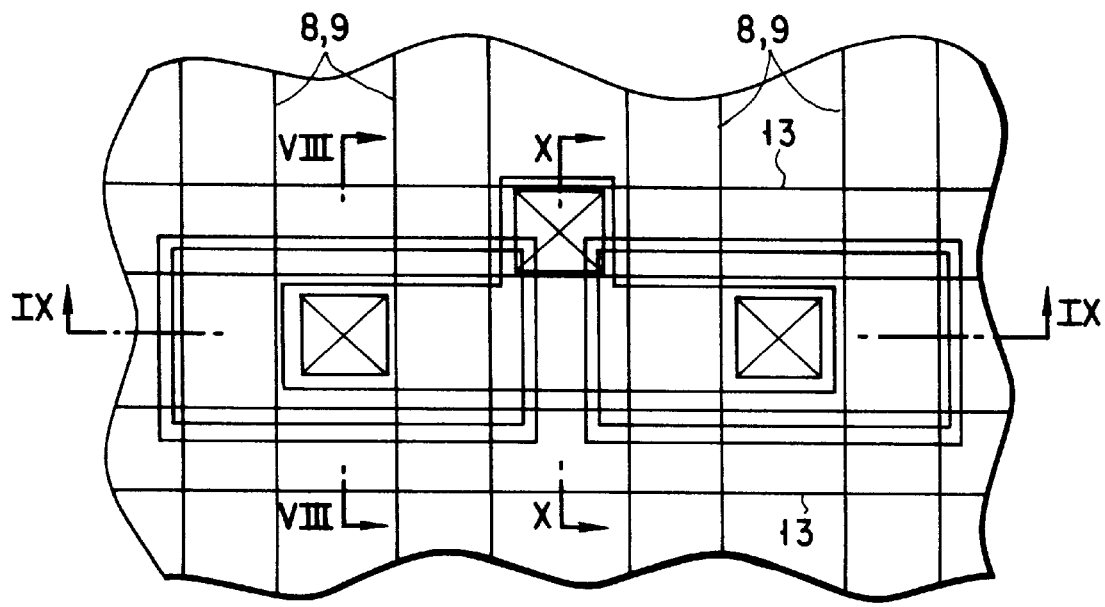
F I G. 7

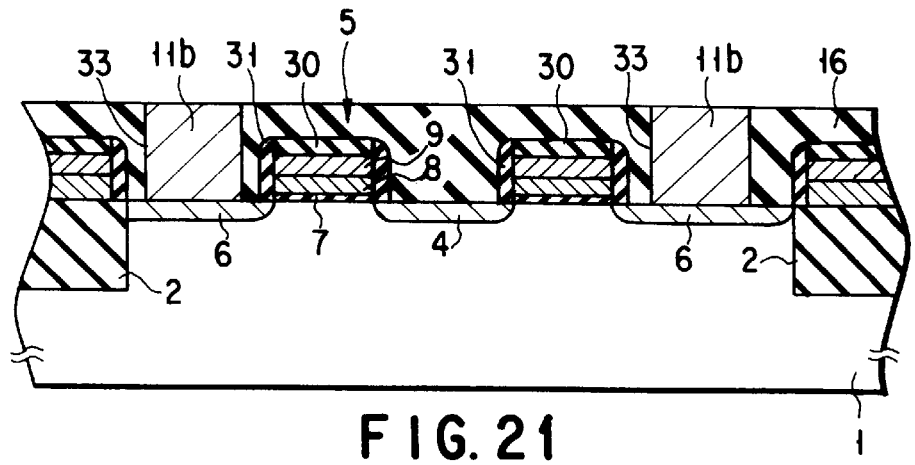
F I G. 21
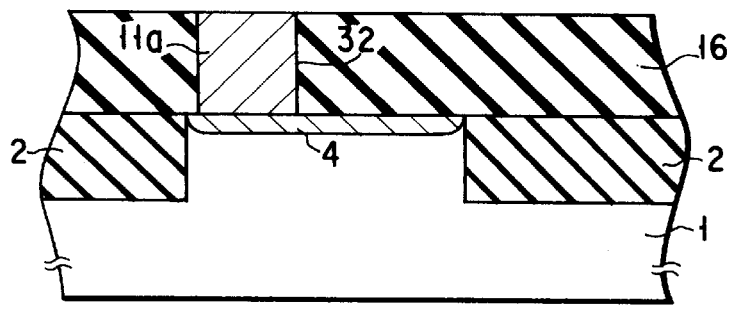
F I G. 22
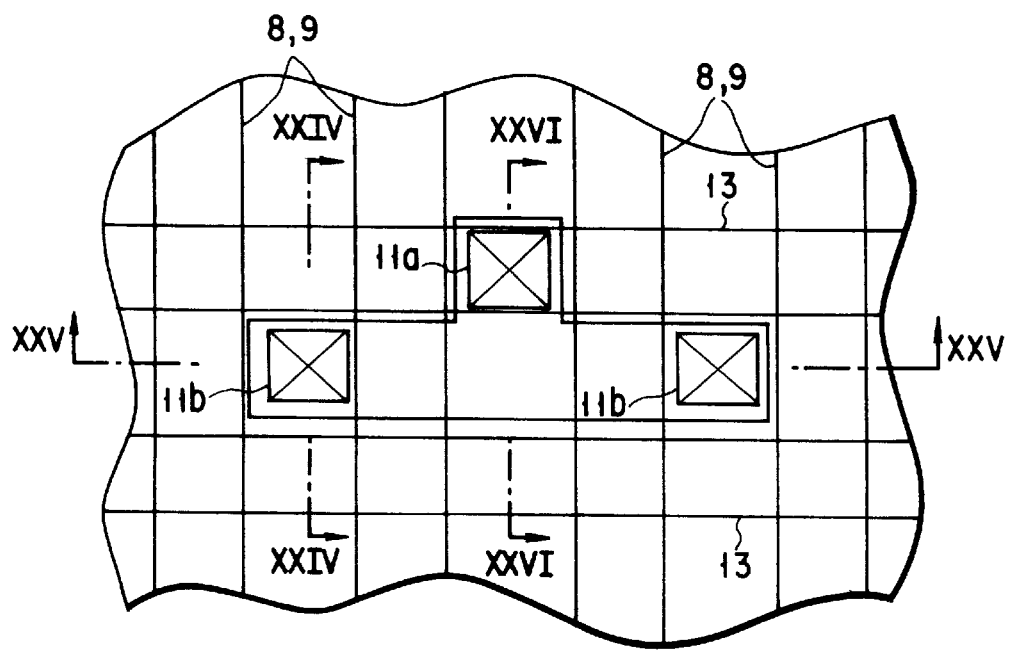
F I G. 23

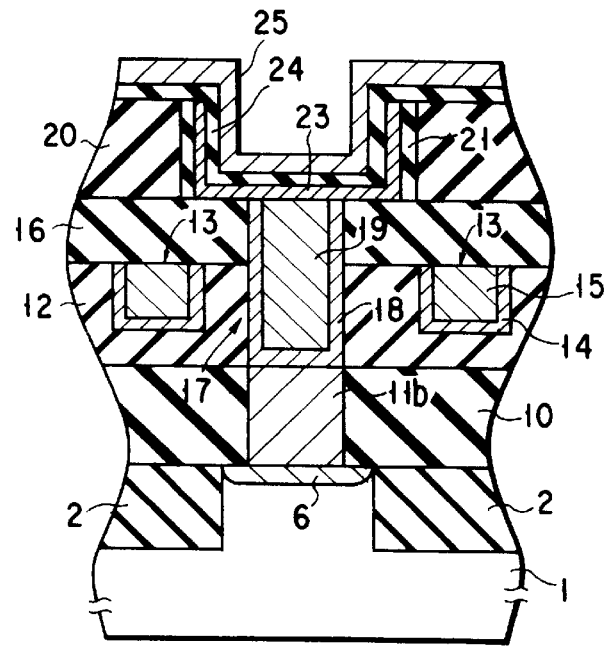
F I G. 48
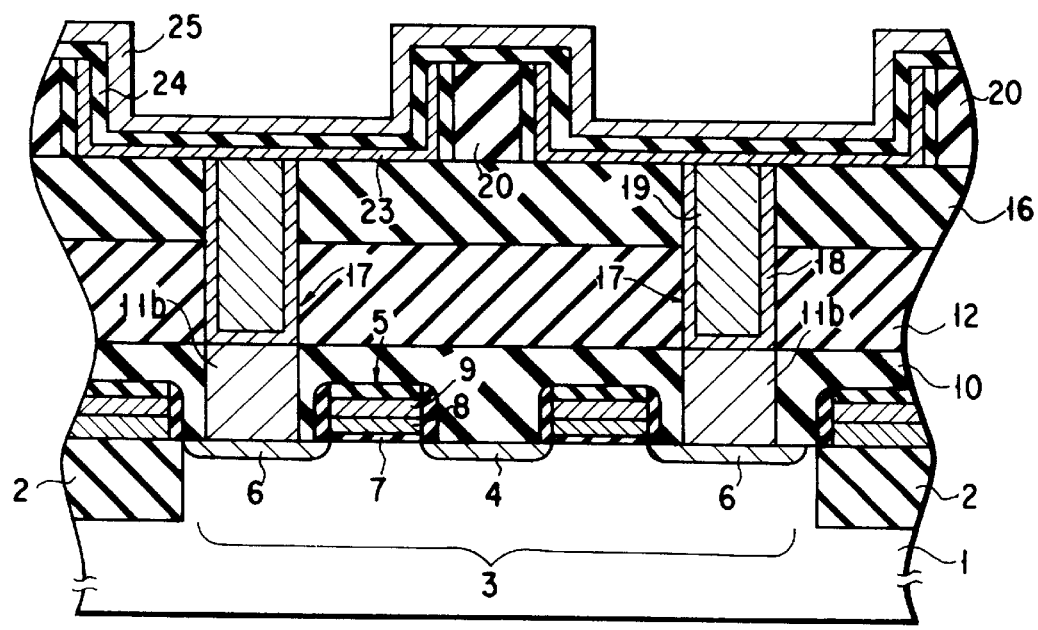
F I G. 49

STRUCTURE OF A CAPACITOR SECTION OF A DYNAMIC RANDOM-ACCESS MEMORY

BACKGROUND OF THE INVENTION

This invention relates to a structure of a capacitor section of a dynamic random-access memory.

As the semiconductor manufacturing technology evolves, the integration density of semiconductor devices is progressively increasing. The higher the integration density of a dynamic random-access memory (hereinafter referred to as "DRAM"), the larger the storage capacity (the number of bits) of the memory, and the smaller the area which each memory cell (one bit) occupies on the semiconductor substrate.

To reduce the area each memory cell occupies, it is necessary to decrease the sizes of the MOS transistor and capacitor which constitute the memory cell. The capacitor incorporated in each memory cell of the DRAM must maintain its capacitance at tens of fF's, no matter how much the area the memory cell occupies is reduced.

Various types of capacitors have been developed for use in the memory cells of DRAMs. One is a stacked type which have storage electrodes (or storage nodes) stacked one above another on a semiconductor substrate. Another is a trench type which has a storage electrode formed in a trench made in a semiconductor substrate and which has a three-dimensional structure.

The stacked type capacitor has a trench in each interlayer insulator provided on the semiconductor substrate. One storage electrode is formed on the sides and bottom of the trench and has an area greater and, hence, a larger capacitance, than otherwise. (See, for example, U.S. Pat. No. 5,444,013.)

It is proposed that the capacitor insulating film be made of high-dielectric materials, instead of the conventionally used ones such as silicon oxide and silicon nitride, so that the capacitor may have capacitance sufficiently large. Examples of high-dielectric materials are: tantalum oxide ($Ta_2O_5$), strontium titanate ($SrTiO_3$, known as "STO"), and barium strontium titanate (($Ba, Sr)TiO_3$, known as "BSTO").

An example of a memory cell which has a capacitor film made of high-dielectric material is disclosed in A. Yuuki et al., "International Electron Device Meeting 1995," pages 115 to 118. The capacitor of this memory cell has a simple stacked structure. Its storage electrodes are made of ruthenium and its capacitor insulating film is made of BSTO.

FIG. 1 shows capacitors formed in trenches made in an interlayer insulator. FIG. 2 is a sectional view taken along line II—II in FIG. 1.

The capacitors are arranged on the semiconductor substrate, forming an array. Each capacitor is composed of a storage electrode 53 and a plate electrode 55. The storage electrode 53 is provided on the sides and bottom of the trench 52 made in the interlayer insulator 51. The plate electrode 55 is provided common to all capacitors.

Capacitors of this type are used in the memory cells of DRAMs. Their storage electrodes are connected to one of the source and drain diffusion layers of MOS transistors by contact plugs 50.

As shown in FIGS. 1 and 2, an interlayer insulator 51 isolates any two adjacent capacitors. The recent trend is that the distance d between the capacitors is reduced, increasing the area of each capacitor as much as possible, thereby to prevent the capacitance of each capacitor from decreasing in spite of the reduced size of the memory cells. If the distance d is reduced, however, the leakage current flowing between the adjacent capacitors will increase, or insulation breakdown will occur between the storage electrodes of the adjacent capacitors. If the leakage current increases the insulation breakdown occurs, the capacitors cannot be electrically isolated so sufficiently that the cell may function well enough in DRAMs.

BRIEF SUMMARY OF THE INVENTION

This invention has been made in view of the foregoing. The object of the invention is to provide a new type of insulating structure which enables a capacitor to function sufficiently even if the interval between it and any other capacitor is small in a dynamic random-access memory.

To attain the object mentioned above, a semiconductor device according to this invention comprises a first insulating film having a trench; a second insulating film provided on only the sides of the trench of the first insulating film; a first electrode provided in the trench of the first insulating film; a third insulating film provided in the trench of the first insulating film and covering the second insulating film; and a second electrode provided on the third insulating film.

Another semiconductor device according to the invention comprises: a first insulating film having a plurality of trenches; a plurality of second insulating films provided only the sides of the trenches of the first insulating film; a plurality of first electrodes provided in the trenches of the first insulating film and covering the second insulating films; a third insulating film provided on the first electrodes; and a second electrode provided on the third insulating film.

According to this invention, there is provided a method of manufacturing a semiconductor device, which comprises the steps of: forming a trench in a first insulating film; forming a second insulating film on only the sides of the trench of the first insulating film; forming a first electrode in the trench of the first insulating film, thereby covering the second insulating film; forming a third insulating film on the first electrode; and forming a second electrode on the third insulating film.

Another method of manufacturing a semiconductor device, according to the invention, comprises the steps of: forming a contact plug connected to one of the source diffusion layer and drain diffusion layer of a MOS transistor; forming a first insulating film covering the contact plug; forming in the first insulating film a trench which reaches the contact plug; forming a second insulating film on only the sides of the trench of the first insulating film; forming a first electrode in the trench of the first insulating film, the first electrode covering the second insulating film and connected to the contact plug; forming a third insulating film on the first electrode; and forming a second electrode on the third insulating film.

Additional object and advantages of the invention will be set forth in the description which follows, and in part will be obvious from the description, or may be learned by practice of the invention. The object and advantages of the invention may be realized and obtained by means of the instrumentalities and combinations particularly pointed out in the appended claims.

BRIEF DESCRIPTION OF THE SEVERAL VIEWS OF THE DRAWING

The accompanying drawings, which are incorporated in and constitute a part of the specification, illustrate presently preferred embodiments of the invention, and together with the general description given above and the detailed description of the preferred embodiments given below, serve to explain the principles of the invention.

FIG. 6 is a sectional view taken along line VI—VI in FIG. 5;

FIG. 7 is a plan view illustrating a second embodiment of the capacitor section of the DRAM according to the invention;

FIG. 21 is a sectional view taken along line XXI—XXI in FIG. 19;

FIG. 22 is a sectional view taken along line XXII—XXII in FIG. 19;

FIG. 23 is a plan view explaining one of the steps of manufacturing a DRAM according to the present invention;

FIG. 48 is a sectional view taken along line XLVIII—XLVIII in FIG. 47;

FIG. 49 is a sectional view taken along line XLVIX—XLVIX in FIG. 47; and

DETAILED DESCRIPTION OF THE INVENTION

The capacitor sections of dynamic random-access memories according to this invention will be described, with reference to the accompanying drawings.

Figure 1:
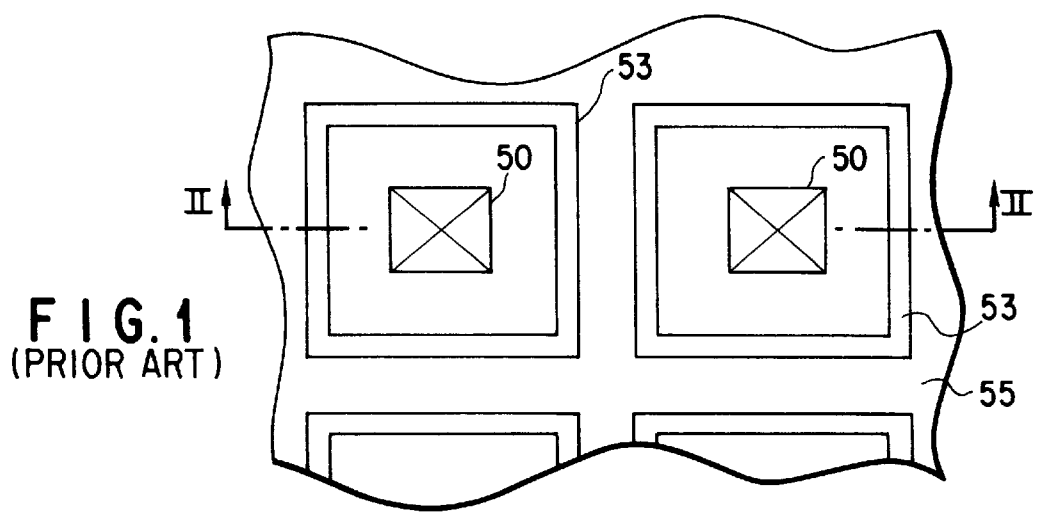
FIG. 1 is a plan view showing the major components of a conventional DRAM.
Figure 2:
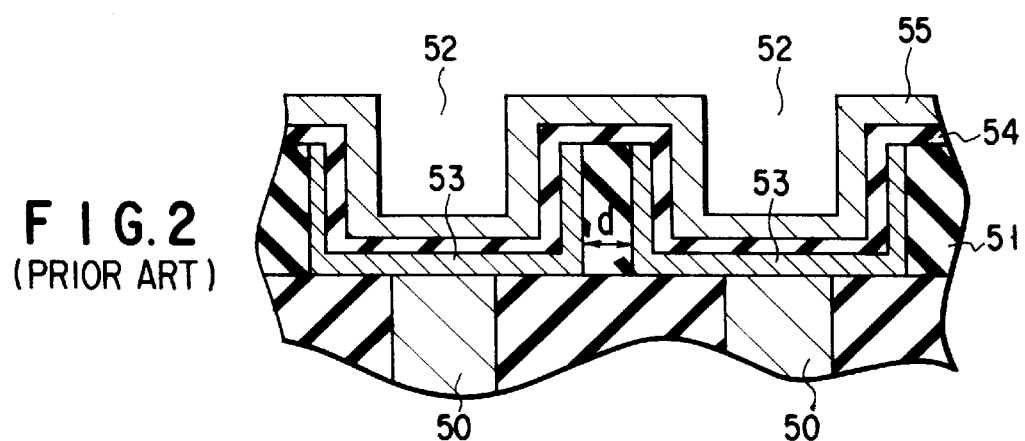
FIG. 2 is a sectional view taken along line II—II in FIG. 1.
Figure 3:
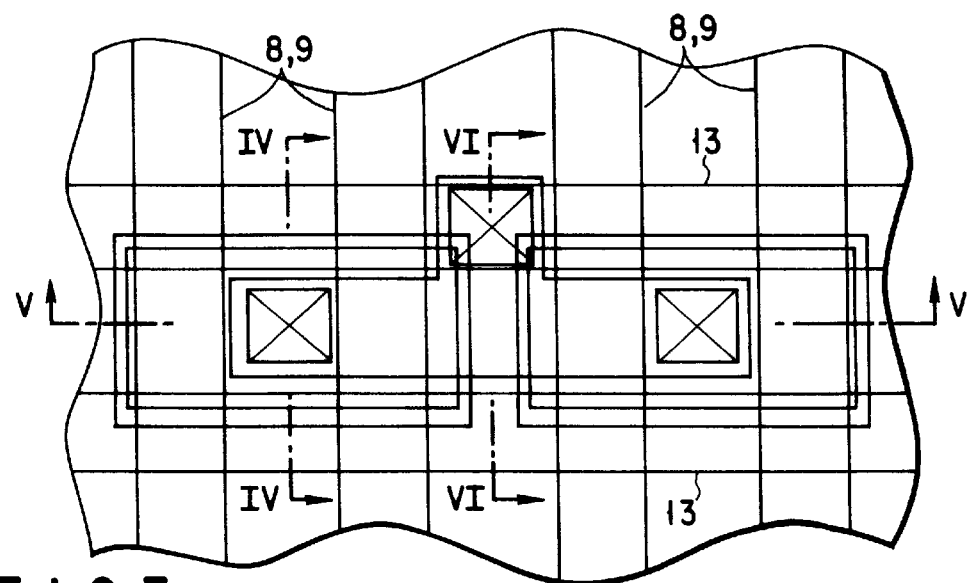
FIG. 3 is a plan view illustrating a first embodiment of the capacitor section of a DRAM according to the invention.
Figure 4:
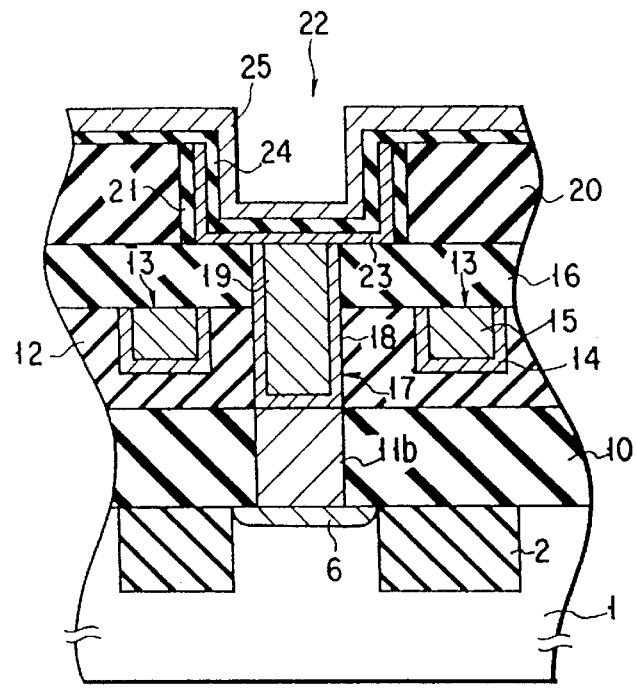
FIG. 4 is a sectional view taken along line IV—IV in FIG. 3.
Figure 5:
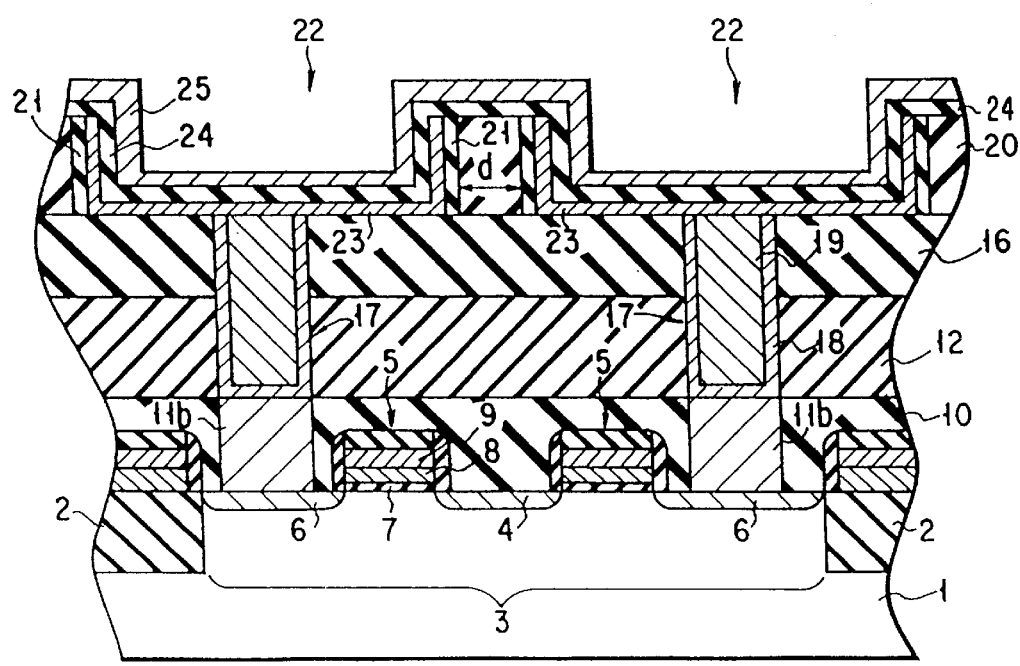
FIG. 5 is a sectional view taken along line V—V in FIG. 3.

FIG. 3 is a plan view illustrating the first embodiment of the capacitor section of a DRAM according to the invention. FIG. 4 is a sectional view taken along line IV—IV in FIG. 3. FIG. 5 is a sectional view taken along line V—V in FIG. 3. FIG. 6 is a sectional view taken along line VI—VI in FIG. 3.

For the sake of simplicity, FIGS. 3 to 6 show only two bit sections (two memory cells) of the DRAM, though the capacitors of many memory cells are arranged in rows and columns, forming a matrix, on the silicon substrate 1 of the DRAM.

The P-type silicon substrate 1 has a trench. An element-isolating film 2 is formed in the trench. The film 2 is an insulating film of the structure known as "shallow trench isolation". The element-isolating film 2 is made of, for example, silicon oxide. A field oxide film formed by LOCOS oxidation may replace the film 2.

The element-isolating film 2 surrounds an element region 3. Two MOS transistors 5 are formed in the element region 3. The MOS transistors 5 share a diffusion layer (source or drain) 4. Each MOS transistor 5 has a diffusion layer 4, a diffusion layer (source or drain) 6, a gate oxide film 7, and a gate electrode.

The gate oxide film 7 is made of, for example, silicon oxide. The gate electrode comprises an n-type polysilicon layer 8 and a silicide layer 9 provided on the polysilicon layer 8. The polysilicon layer 8 contains impurities (e.g., phosphorus). The silicide layer 9 is made of, for example, tungsten silicide.

The MOS transistors 5 are covered with an interlayer insulator 10 made of, for example, silicon oxide. The interlayer insulator 10 has a contact hole in that part which is provided on the diffusion layer 4. A contact plug 11a is formed in the contact hole. The interlayer insulator 10 has two other contact holes in those parts which are provided on the diffusion layers 6. Contact plugs 11b are formed in these contact holes, respectively. The contact plugs 11a and 11b are made of, for instance, polysilicon containing impurities.

An interlayer insulator 12 made of, for example, silicon oxide, is formed on the interlayer insulator 10. The interlayer insulator 12 has a trench and a contact hole, in which wires are provided. More specifically, bit lines 13 are formed in the trench and the contact hole. The bit line 13 formed in the contact hole is connected to the contact plug 11a. Both bit lines 13 comprise, for example, a barrier metal layer 14 (Ti layer, TiN layer or the like) and a refractory metal layer 15 (tungsten layer or the like).

An interlayer insulator 16 made of, for example, silicon oxide is provided on the interlayer insulator 12. The interlayer insulators 12 and 16 has contact holes which reach the contact plugs 11b. Contact plugs 17 are formed in these contact holes and are hence connected to the contact plugs 11b. The contact plugs 17 comprise a barrier metal layer 18 (Ti layer, TiN layer or the like) and a refractory metal layer 19 (tungsten layer or the like).

An interlayer insulator 20 made of, for example, silicon oxide is provided on the interlayer insulator 16. The interlayer insulator 20 has trenches in those parts which are located above the contact plugs 17. An insulating film 21 (silicon nitride film or the like) is formed on the sides of each trench.

Capacitors 22 are provided in the trenches. Each capacitor 22 comprises a storage electrode 23 (storage node), a capacitor insulating film 24, and a plate electrode 25. The storage electrode 23 is formed on the sides and bottom of the trench and connected to the contact plug 17. The capacitor insulating film 24 is provided on the storage electrode 23. The plate electrode 25 is common to all capacitors 22 provided.

In the DRAM, an insulating film 21 (a silicon nitride film or the like) is formed on the sides of one trench, as mentioned above. In other words, a laminate composed of the interlayer insulator 20 and the insulating film 21 is provided between the storage electrodes of the two adjacent capacitors 22. Namely, the laminate electrically isolate the capacitors 22 from each other.

The insulating films 20 and 21 are made of material and have thickness which are selected on the basis of the size of the trenches and the thickness of the storage electrode 23, the capacitor insulating film 24 and plate electrode 25. The capacitors 22 are therefore electrically isolated sufficiently and can function well in DRAMs, though the interval d between them is reduced.

Figure 8:
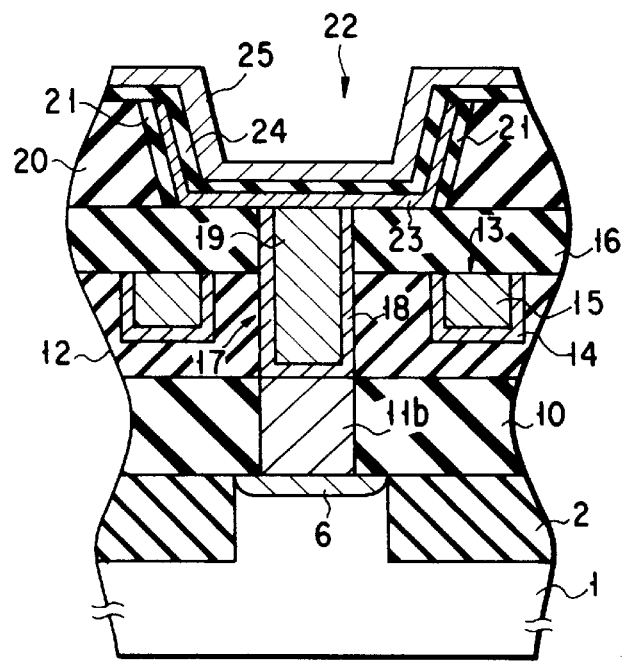
FIG. 8 is a sectional view taken along line VIII—VIII in FIG. 7.
Figure 9:
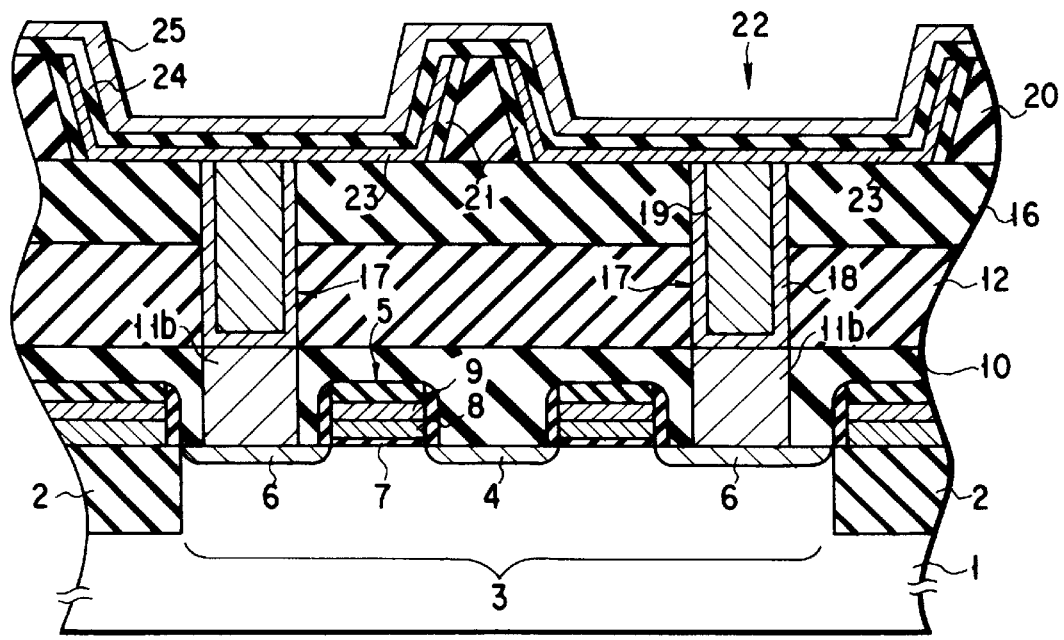
FIG. 9 is a sectional view taken along line IX—IX in FIG. 7.
Figure 10:
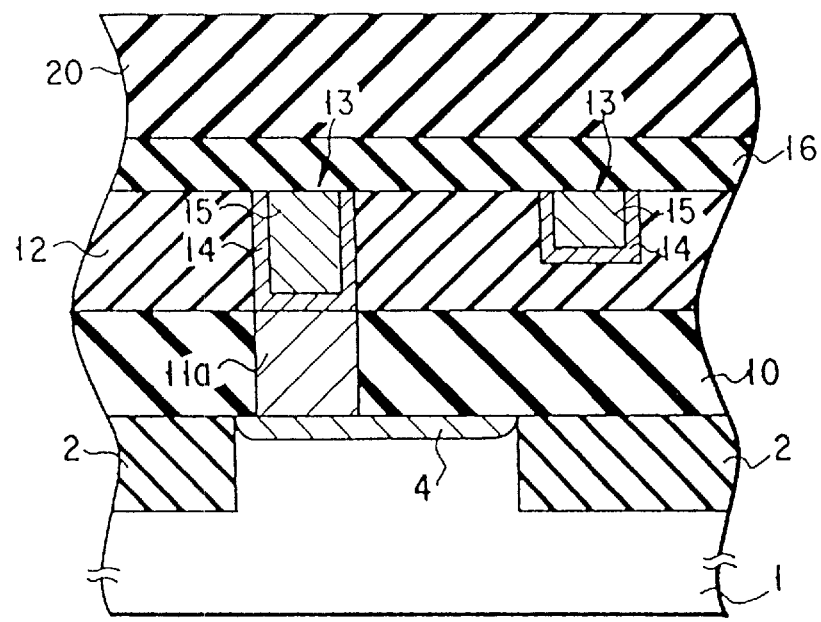
FIG. 10 is a sectional view taken along line IX—IX in FIG. 7.

FIG. 7 is a plan view illustrating the second embodiment of the capacitor section of the DRAM according to the invention. FIG. 8 is a sectional view taken along line VIII—VIII in FIG. 7. FIG. 9 is a sectional view taken along line IX—IX in FIG. 7. FIG. 10 is a sectional view taken along line X—X in FIG. 7.

For the sake of simplicity, FIGS. 7 to 10 show only two bit sections (two memory cells) of the DRAM, though the capacitors of many memory cells are arranged in rows and columns, forming a matrix, on the silicon substrate 1 of the DRAM.

The P-type silicon substrate 1 has a trench. An element-isolating film 2 is formed in the trench. The film 2 is an insulating film of the structure known as "shallow trench isolation." The element-isolating film 2 is made of, for example, silicon oxide. The film 2 may be replaced by a field oxide film formed by LOCOS oxidation.

The element-isolating film 2 surrounds an element region 3. Two MOS transistors 5 are formed in the element region 3. The MOS transistors 5 share a diffusion layer 4. Each MOS transistor 5 has a diffusion layer 4, a diffusion layer 6, a gate oxide film 7, and a gate electrode.

The gate oxide film 7 is made of, for example, silicon oxide. The gate electrode comprises an n-type polyilicon layer 8 and a silicide layer 9 provided on the poliyilicon layer 8. The polysilicon layer 8 contains impurities (e.g., phosphorus). The silicide layer 9 is made of, for example, tungsten silicide.

The MOS transistors 5 are covered with an interlayer insulator 10 made of, for example, silicon oxide. The interlayer insulator 10 has a contact hole in that part which is provided on the diffusion layer 4. A contact plug 11a is formed in the contact hole. The interlayer insulator 10 has two other contact holes in those parts which are provided on the diffusion layers 6. Contact plugs 11b are formed in these contact holes, respectively. The contact plugs 11a and 11b are made of, for instance, polysilicon containing impurities.

An interlayer insulator 12 made of, for example, silicon oxide, is formed on the interlayer insulator 10. The interlayer insulator 12 has a trench and a contact hole, in which wires are provided. More specifically, bit lines 13 are formed in the trench and the contact hole. The bit line 13 formed in the contact hole is connected to the contact plug 11a. Both bit lines 13 comprise, for example, a barrier metal layer 14 (Ti layer, TiN layer or the like) and a refractory metal layer 15 (tungsten layer or the like).

An interlayer insulator 16 made of, for example, silicon oxide is provided on the interlayer insulator 12. The interlayer insulators 12 and 16 have contact holes which reach the contact plugs 11b. Contact plugs 17 are formed in these contact holes and are, hence, connected to the contact plugs 11b. The contact plugs 17 comprise a barrier metal layer 18 (Ti layer, TiN layer or the like) and a refractory metal layer 19 (tungsten layer or the like).

An interlayer insulator 20 made of, for example, silicon oxide is provided on the interlayer insulator 16. The interlayer insulator 20 has trenches in those parts which are located above the contact plugs 17.

The sides of each trench are inclined at 80° or more, but less than 90°, to the surface of the interlayer insulator 16 which has been made flat by chemical mechanical polishing (CMP) or the like. (If the sides are inclined to the surface of the insulator 16 by 90°, the capacitor section will have the same structure as the first embodiment illustrated in FIGS. 3 to 6.)

Since each trench has its sides inclined at 80° or more, but less than 90°, to the surface of the insulator 16, the interlayer insulator 20 existing between the trenches has a cross section which gradually reduces in width toward its top. The gap between the storage electrodes 23 of two adjacent capacitors 22 is therefore very narrow at the top of the interlayer insulator 20. To isolate the storage electrodes 23 sufficiently, an insulating film 21 (silicon nitride film or the like) is formed on the sides of each trench.

The capacitors 22 are provided in the trenches. Each capacitor 22 comprises a storage electrode 23 (storage node), a capacitor insulating film 24, and a plate electrode 25. The storage electrode 23 is formed on the sides and bottom of the trench and connected to the contact plug 17. The capacitor insulating film 24 is provided on the storage electrode 23. The plate electrode 25 is common to all capacitors 22 provided.

In the DRAM, an insulating film 21 (a silicon nitride film or the like) is formed on the sides of one trench, as mentioned above. In other words, a laminate composed of the interlayer insulator 20 and the insulating film 21 is provided between the storage electrodes of the two adjacent capacitors 22. Namely, the laminate electrically isolates the capacitors 22 from each other.

The insulating films 20 and 21 are made of materials and have thickness which are selected on the basis of the size of the trenches and the thickness of the storage electrode 23, the capacitor insulating film 24 and plate electrode 25. Therefore, the capacitors 22 are electrically isolated sufficiently and can function well in DRAMs, though the interval d between them is reduced.

Further, the coverage of the storage electrodes 23, insulating films 24 and plate electrode 25, all formed in the trenches, can be improved since both sides of each trench are inclined. For the same reason, the coverage of the interlayer insulator provided on the plate electrode 25 can be improved in the trenches. Voids are rarely formed in the interlayer insulator provided on the plate electrode 25.

Figure 11:
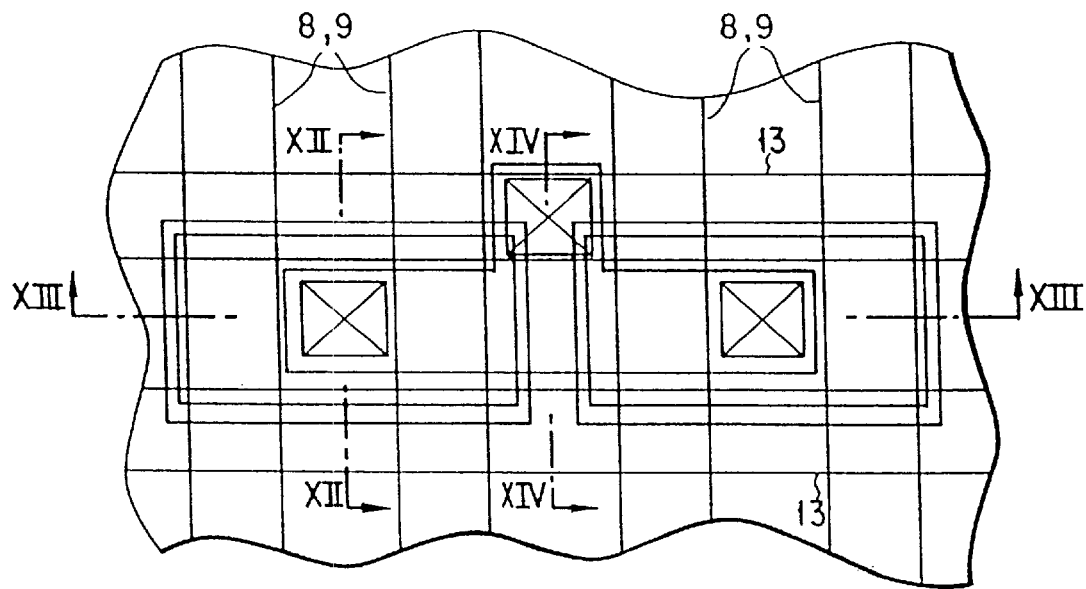
FIG. 11 is a plan view showing a third embodiment of the capacitor section of the DRAM according to the invention.
Figure 12:
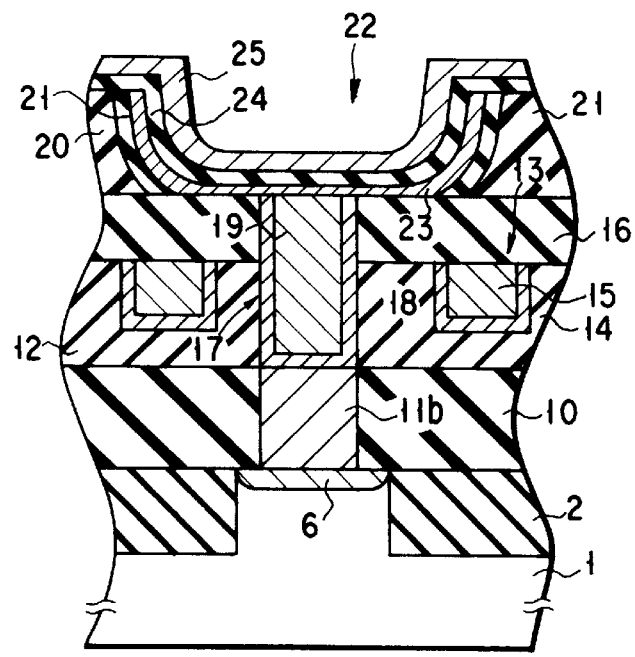
FIG. 12 is a sectional view taken along line XII—XII in FIG. 11.
Figure 13:
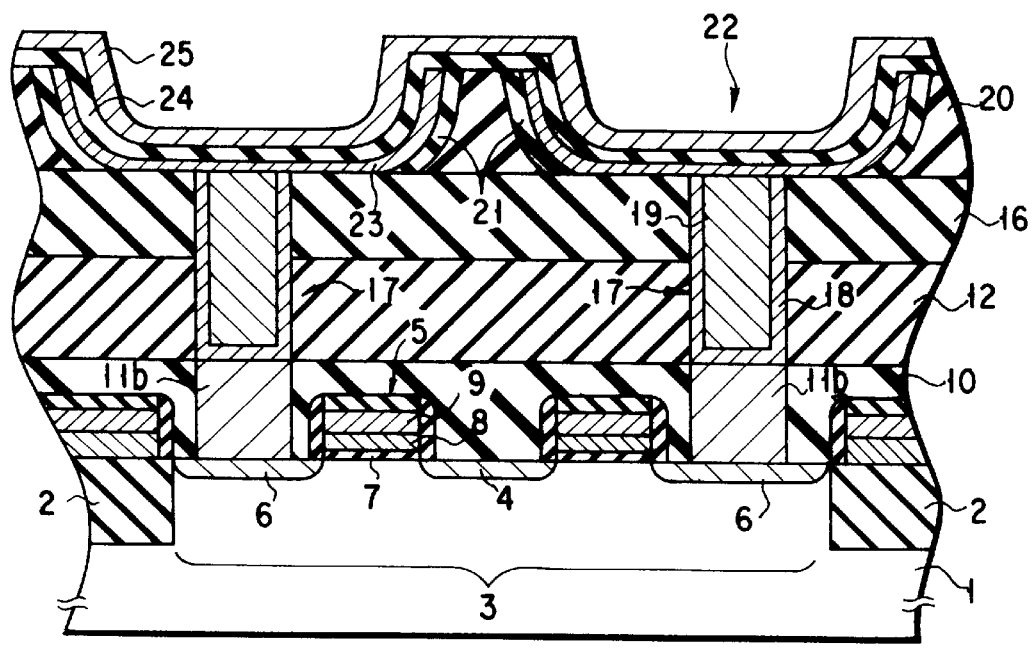
FIG. 13 is a sectional view taken along line XIII—XIII in FIG. 11.
Figure 14:
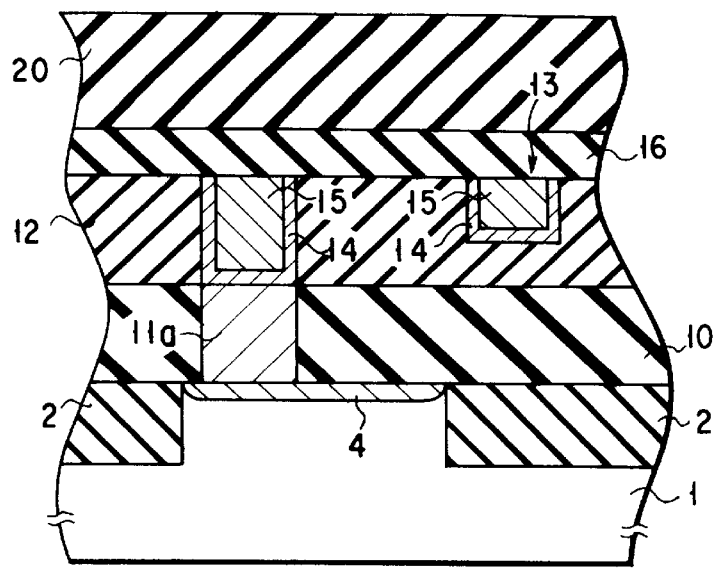
FIG. 14 is a sectional view taken along line XIV—XIV in FIG. 11.
Figure 15:
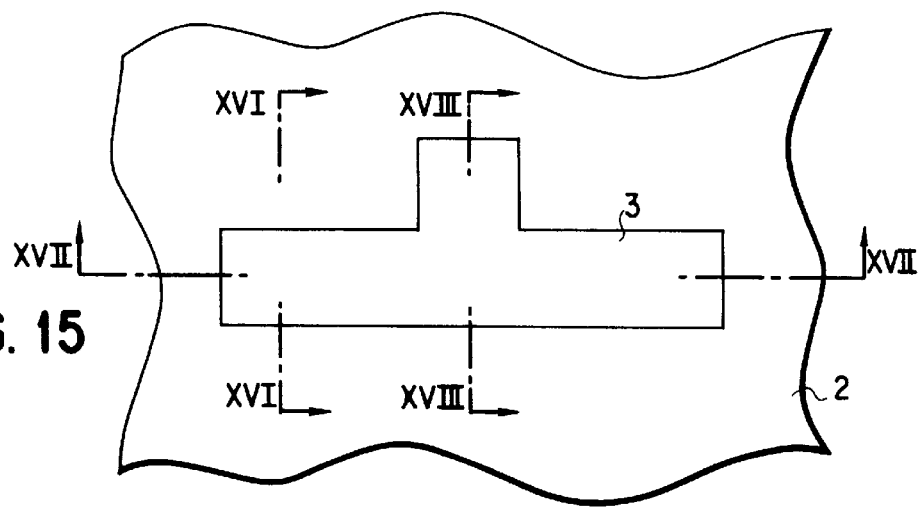
FIG. 15 is a plan view explaining one of the steps of manufacturing a DRAM according to the present invention.
Figure 16:
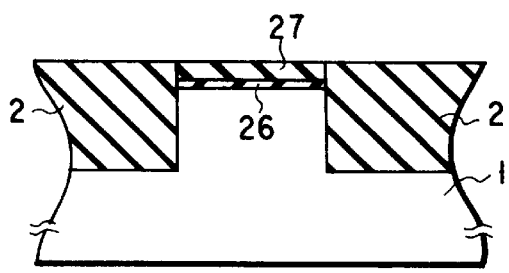
FIG. 16 is a sectional view taken along line XVI—XVI in FIG. 15.
Figure 17:
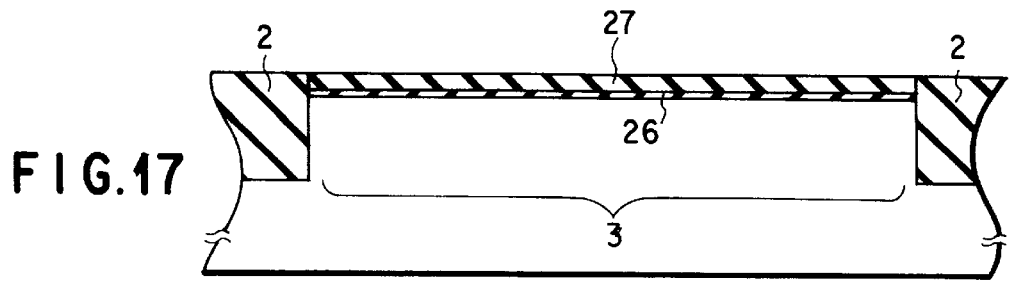
FIG. 17 is a sectional view taken along line XVII—XVII in FIG. 15.
Figure 18:
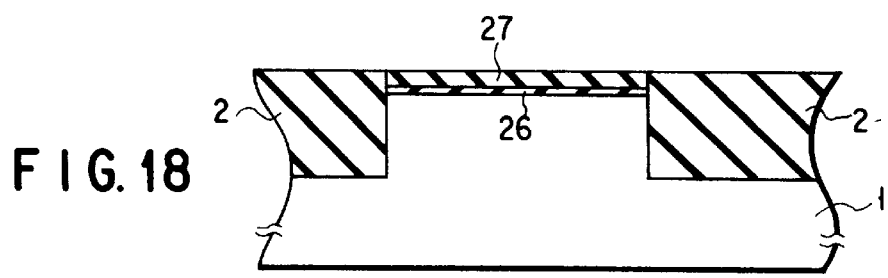
FIG. 18 is a sectional view taken along line XVIII—XVIII in FIG. 11.
Figure 19:
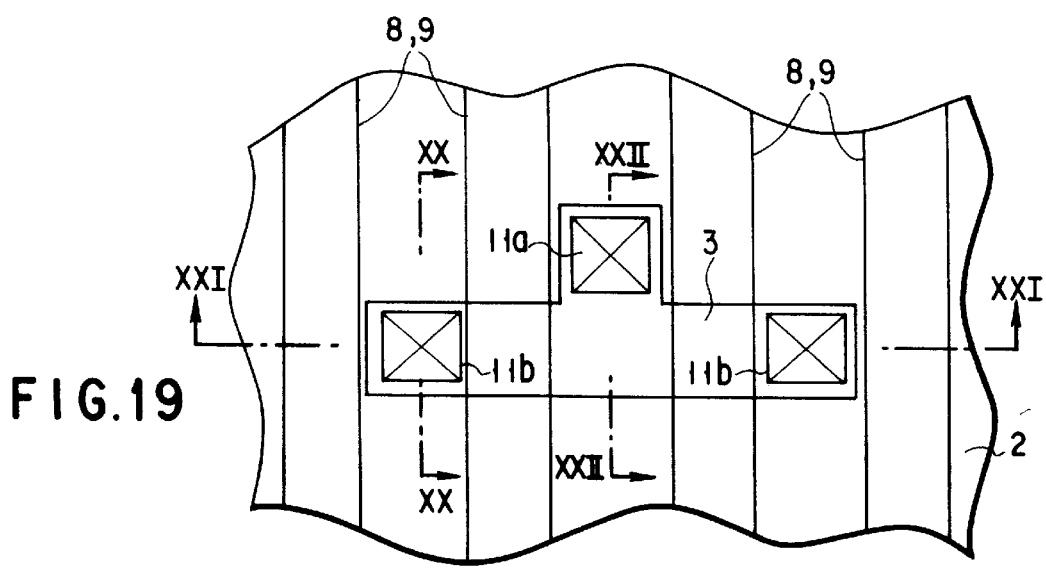
FIG. 19 is a plan view explaining one of the steps of manufacturing a DRAM according to this invention.
Figure 20:
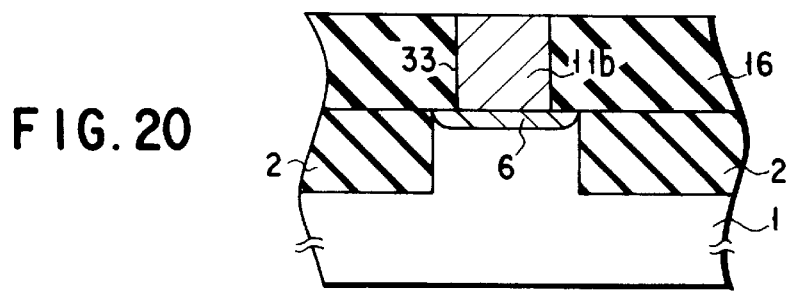
FIG. 20 is a sectional view taken along line XX—XX in FIG. 19.
Figure 24:
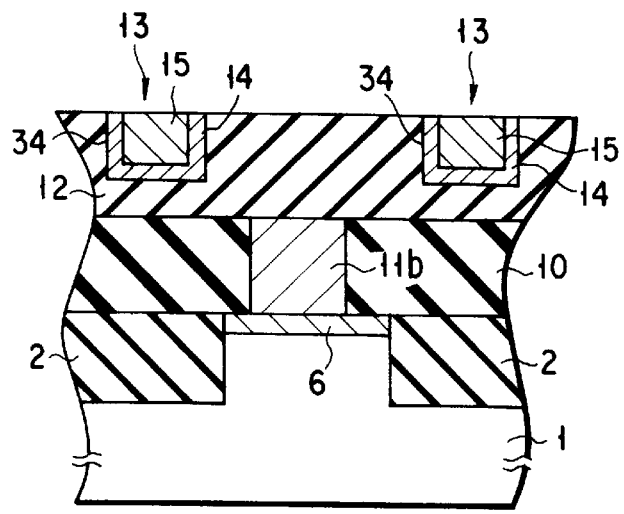
FIG. 24 is a sectional view taken along line XXIV—XXIV in FIG. 23.
Figure 25:
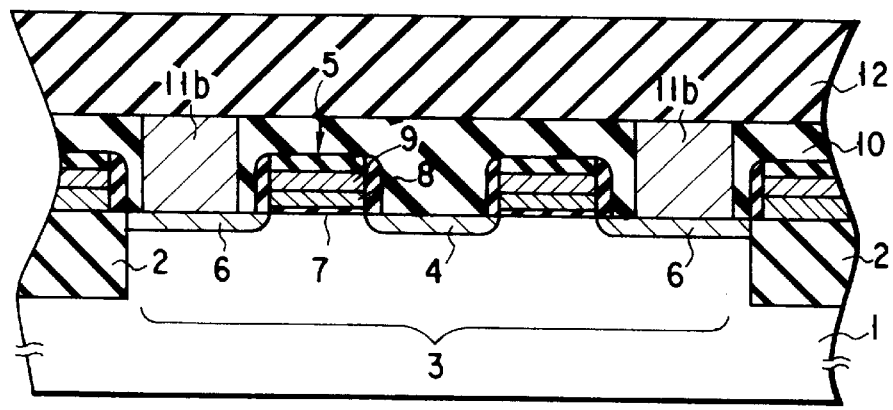
FIG. 25 is a sectional view taken along line XXV—XXV in FIG. 23.
Figure 26:
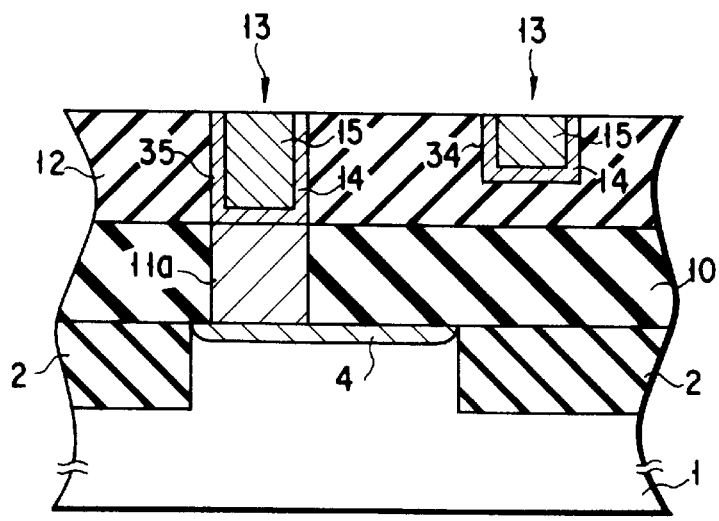
FIG. 26 is a sectional view taken along line XXVI—XXVI in FIG. 23.
Figure 27:
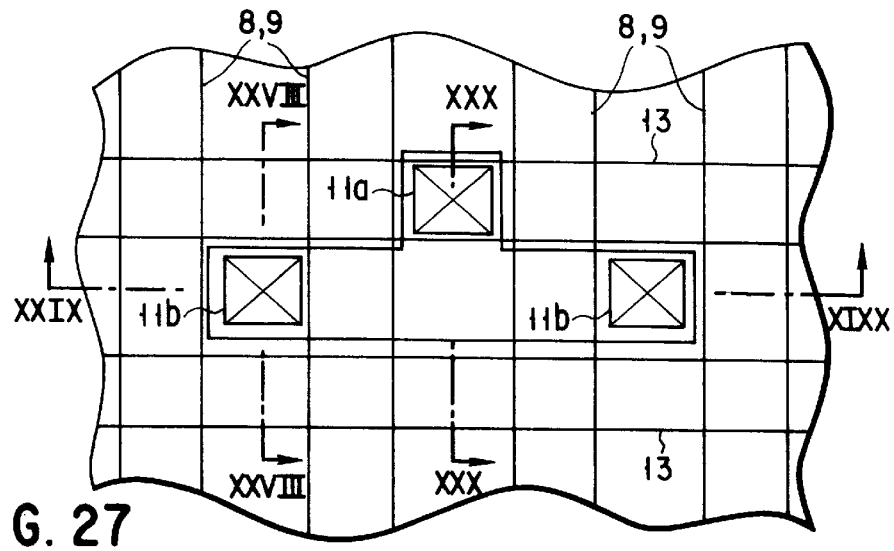
FIG. 27 is a plan view explaining one of the steps of manufacturing a DRAM according to this invention.
Figure 28:
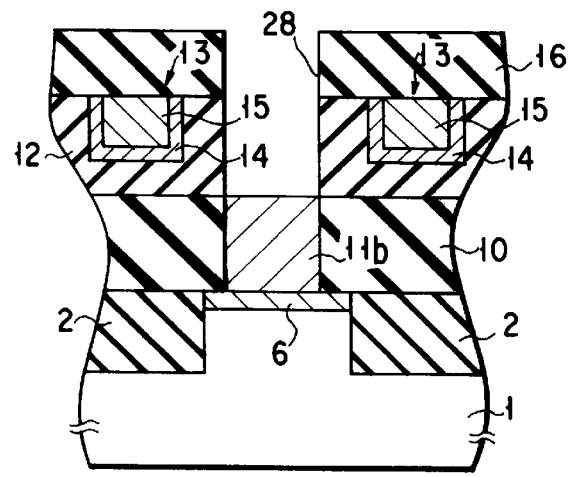
FIG. 28 is a sectional view taken along line XXVIII—XXVIII in FIG. 27.
Figure 29:
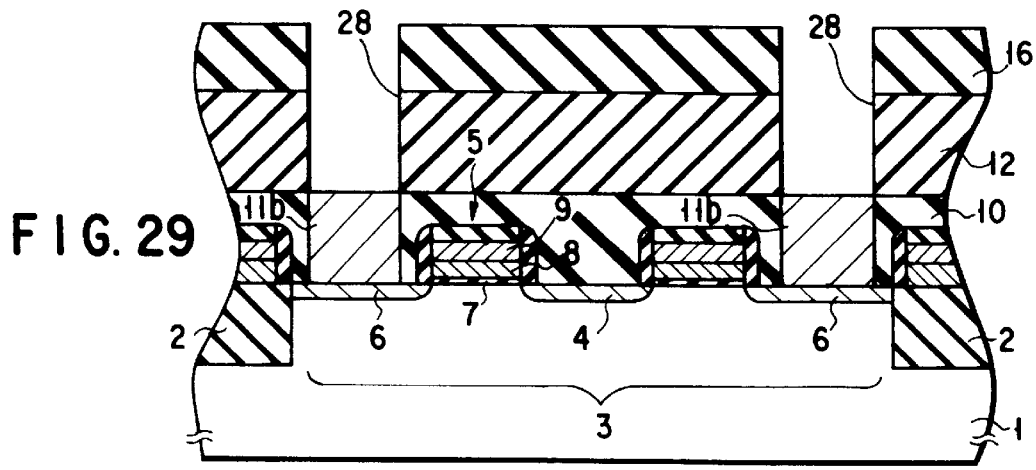
FIG. 29 is a sectional view taken along line XXIX—XXIX in FIG. 27.
Figure 30:
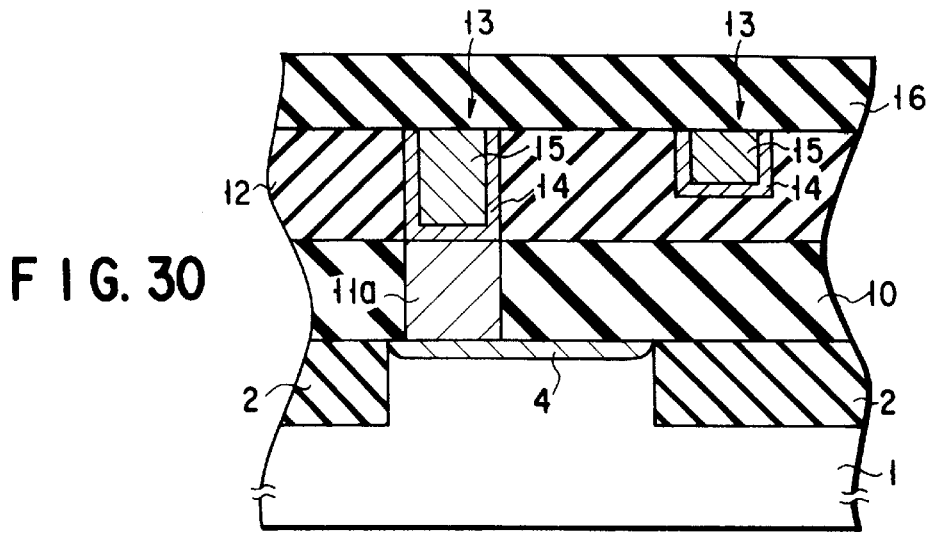
FIG. 30 is a sectional view taken along line XXX—XXX in FIG. 27.
Figure 31:
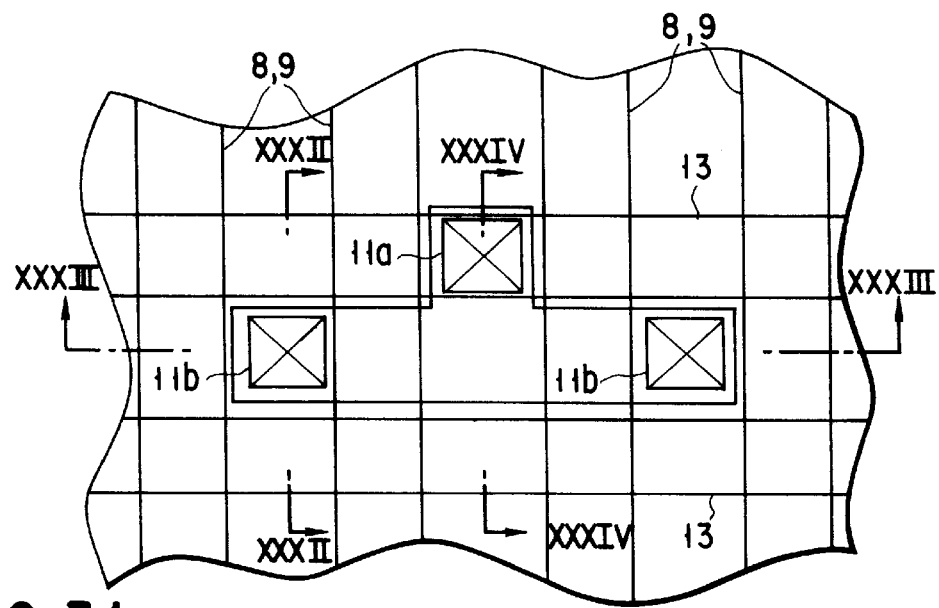
FIG. 31 is a plan view explaining one of the steps of manufacturing a DRAM according to the present invention.
Figure 32:
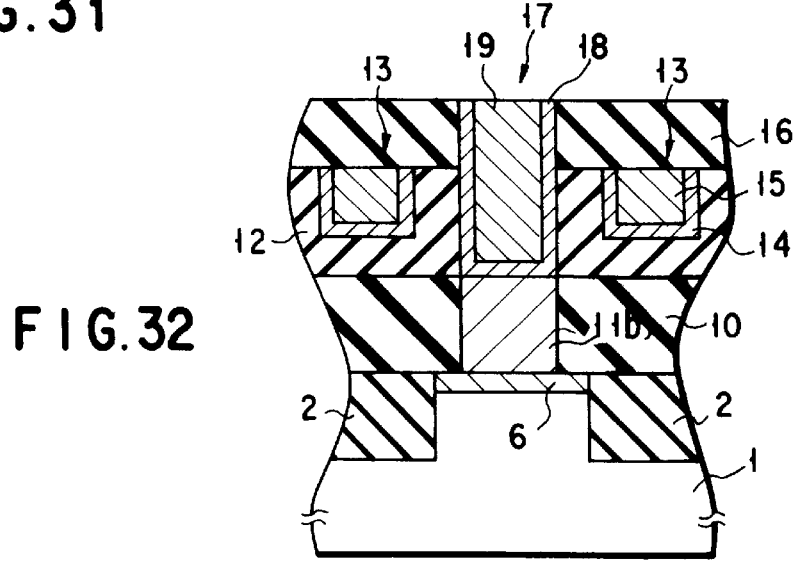
FIG. 32 is a sectional view taken along line XXXII—XXXII in FIG. 31.
Figure 33:
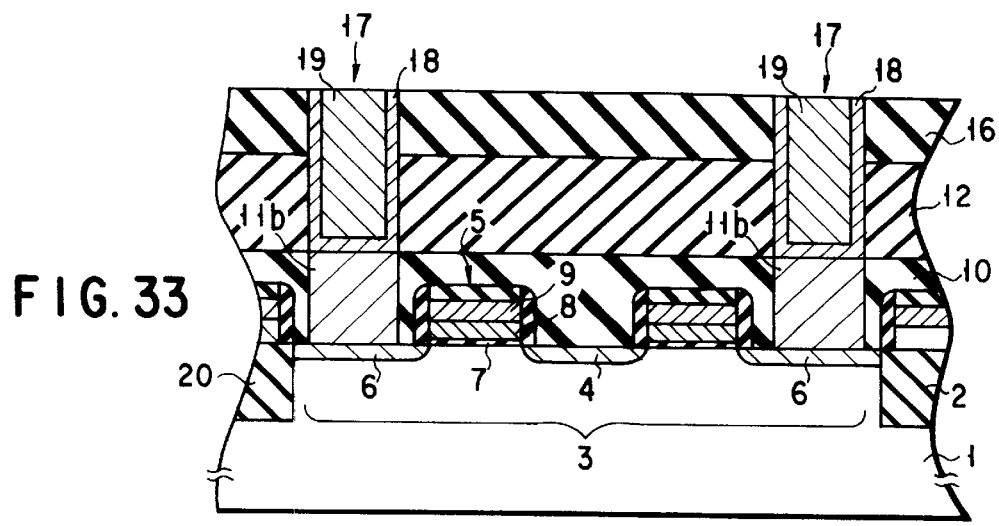
FIG. 33 is a sectional view taken along line XXXIII—XXXIII in FIG. 27.
Figure 34:
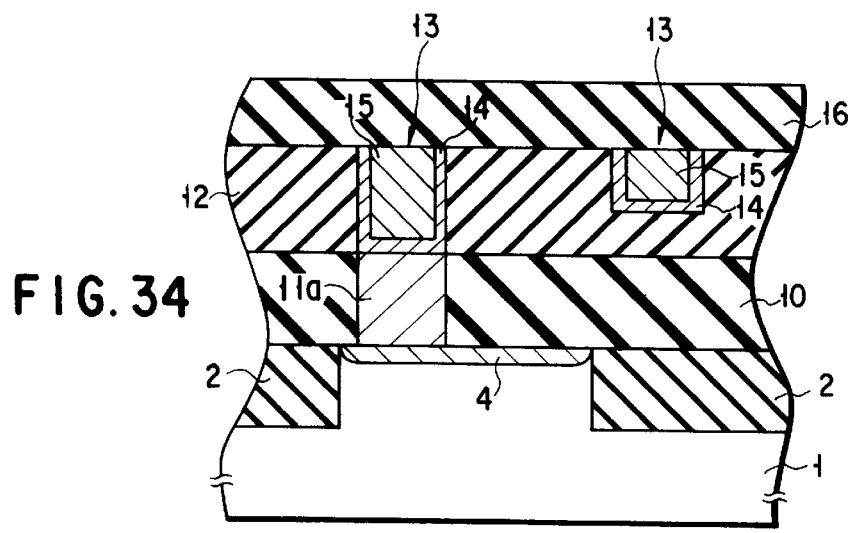
FIG. 34 is a sectional view taken along line XXXIV—XXXIV in FIG. 31.
Figure 35:
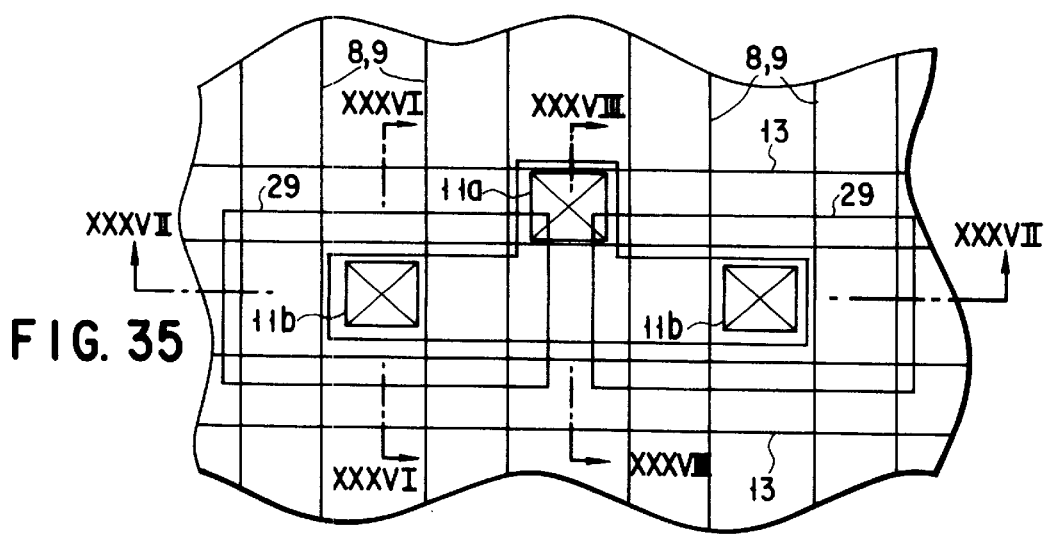
FIG. 35 is a plan view explaining one of the steps of manufacturing a DRAM according to the invention.
Figure 36:
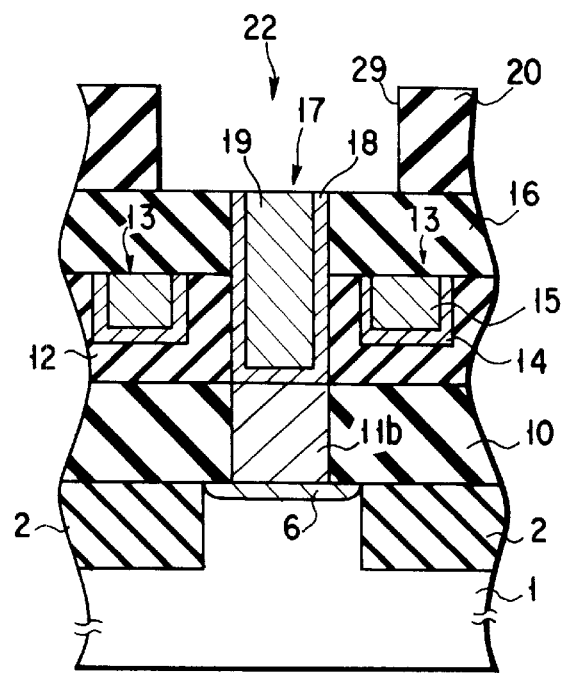
FIG. 36 is a sectional view taken along line XXXVI—XXXVI in FIG. 35.
Figure 37:
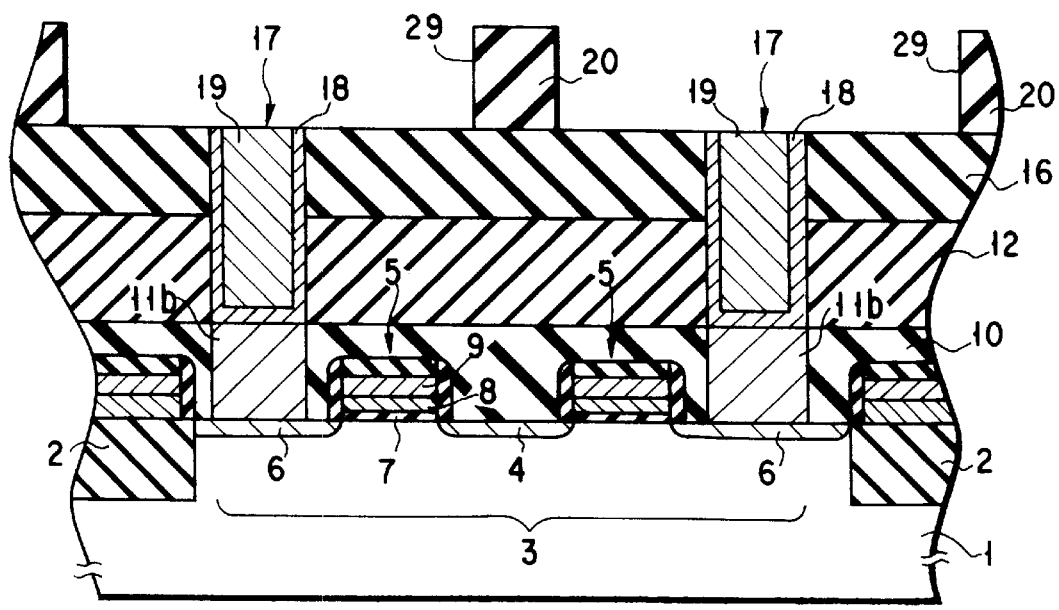
FIG. 37 is a sectional view taken along line XXXVII—XXXVII in FIG. 35.
Figure 38:
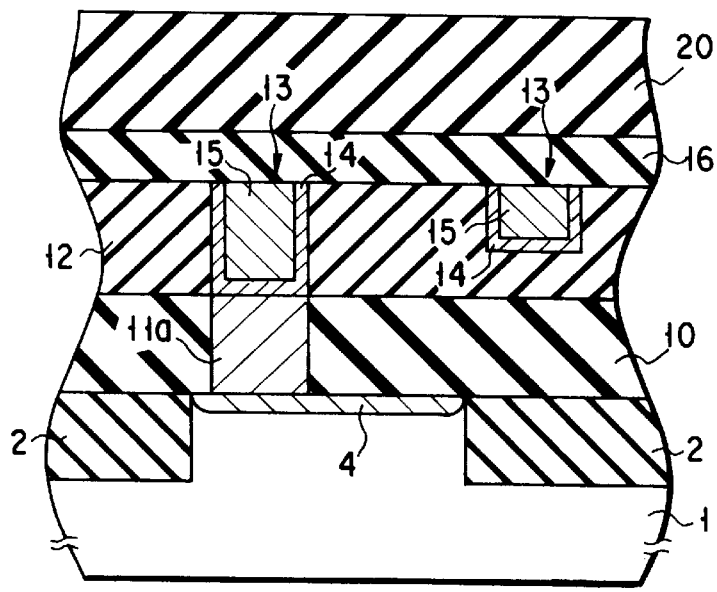
FIG. 38 is a sectional view taken along line XXXVIII—XXXVIII in FIG. 35.
Figure 39:
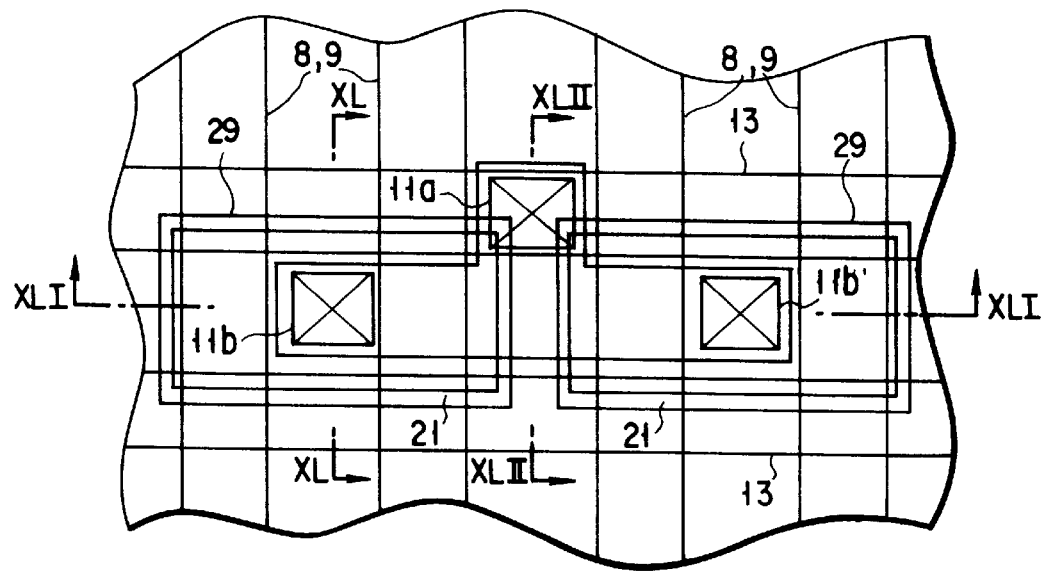
FIG. 39 is a plan view explaining one of the steps of manufacturing a DRAM according to the present invention.
Figure 40:
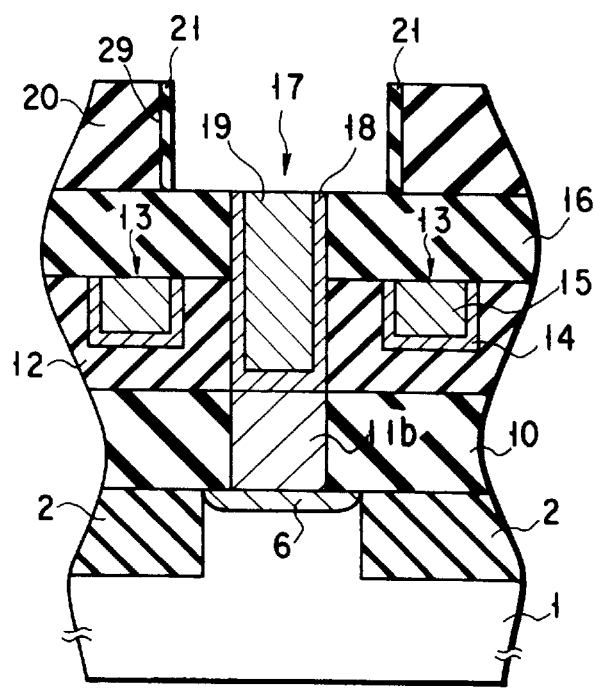
FIG. 40 is a sectional view taken along line XL—XL in FIG. 39.
Figure 41:
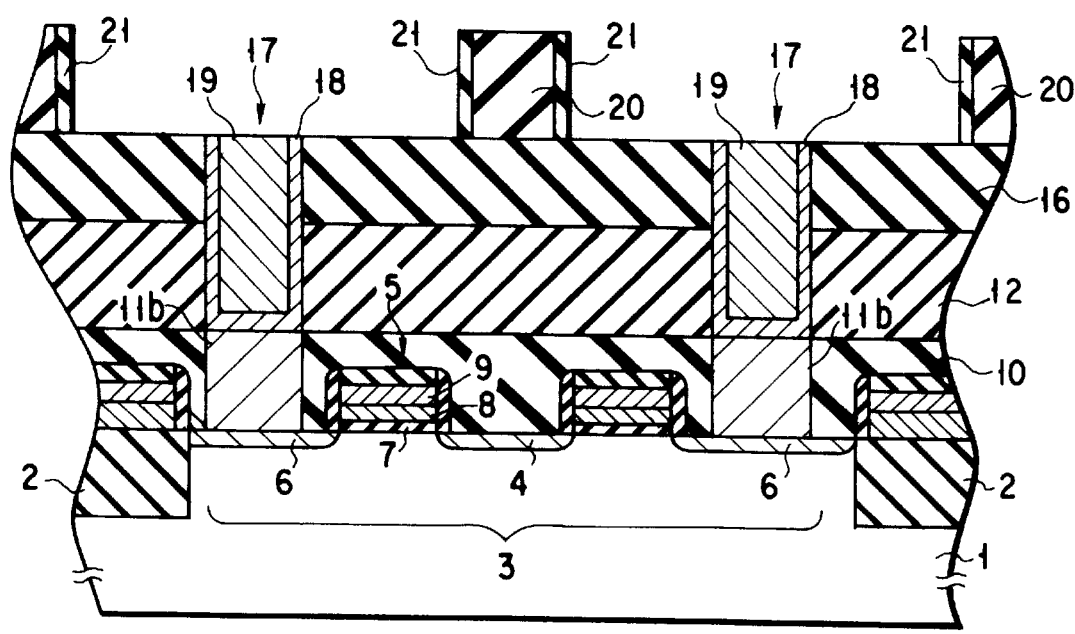
FIG. 41 is a sectional view taken along line XLI—XLI in FIG. 39.
Figure 42:
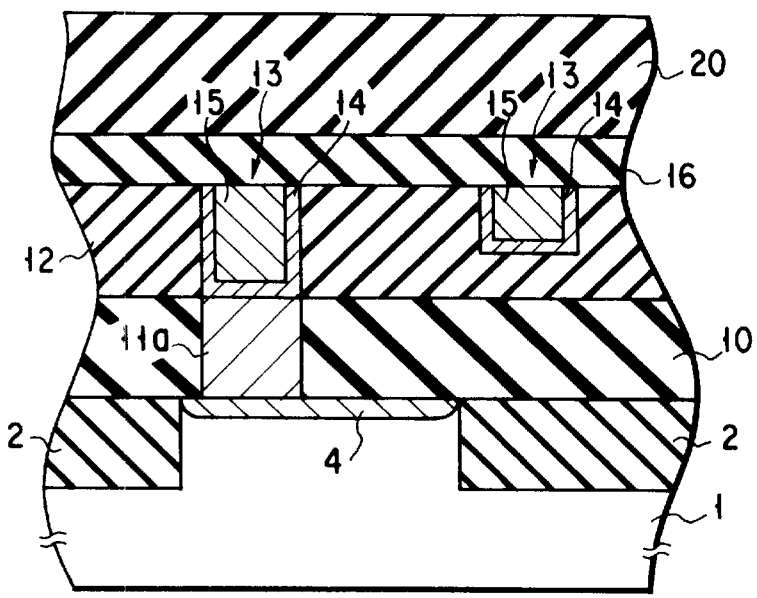
FIG. 42 is a sectional view taken along line XLII—XLII in FIG. 39.
Figure 43:
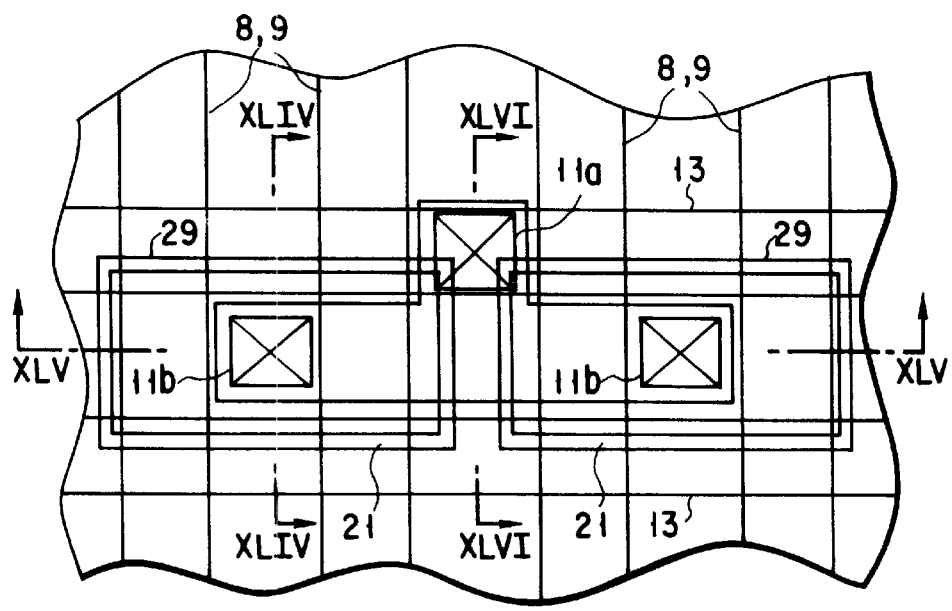
FIG. 43 is a plan view explaining one of the steps of manufacturing a DRAM according to the invention.
Figure 44:
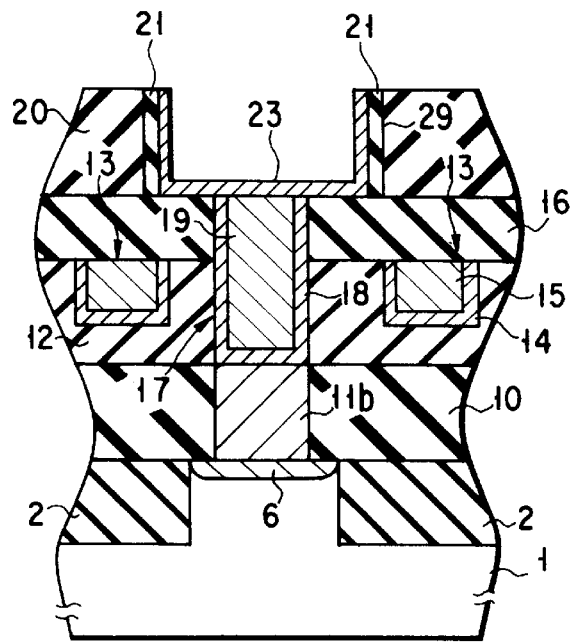
FIG. 44 is a sectional view taken along line XLIV—XLIV in FIG. 43.
Figure 45:
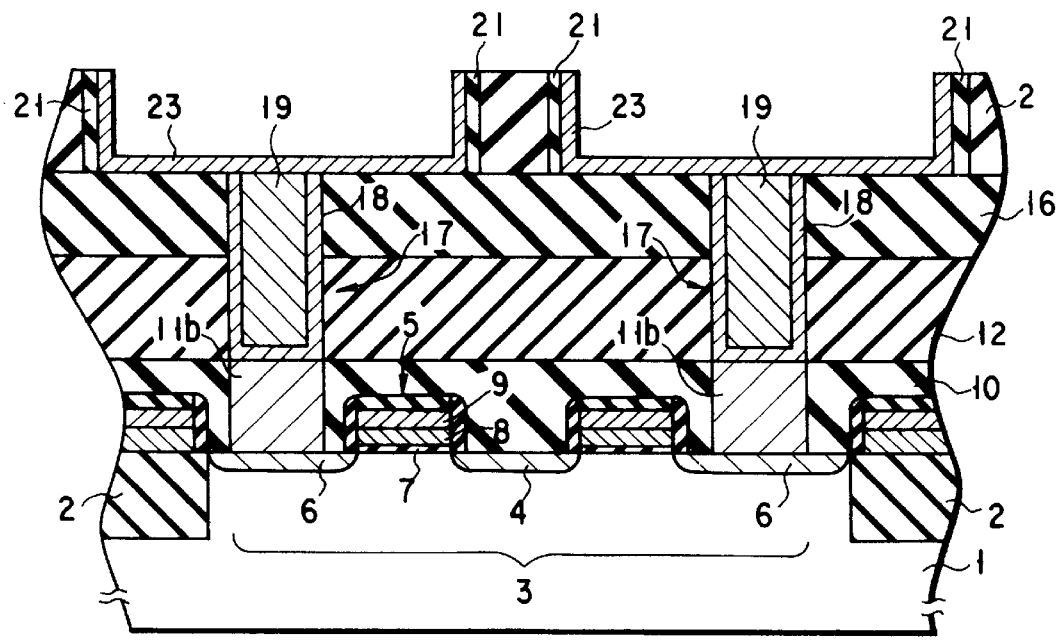
FIG. 45 is a sectional view taken along line XLV—XLV in FIG. 43.
Figure 46:
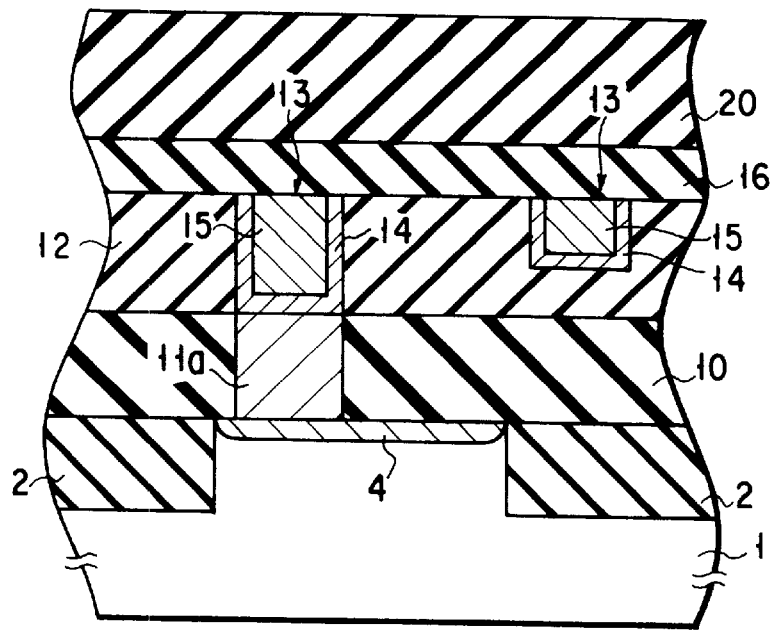
FIG. 46 is a sectional view taken along line XLVI—XLVI in FIG. 43.
Figure 47:
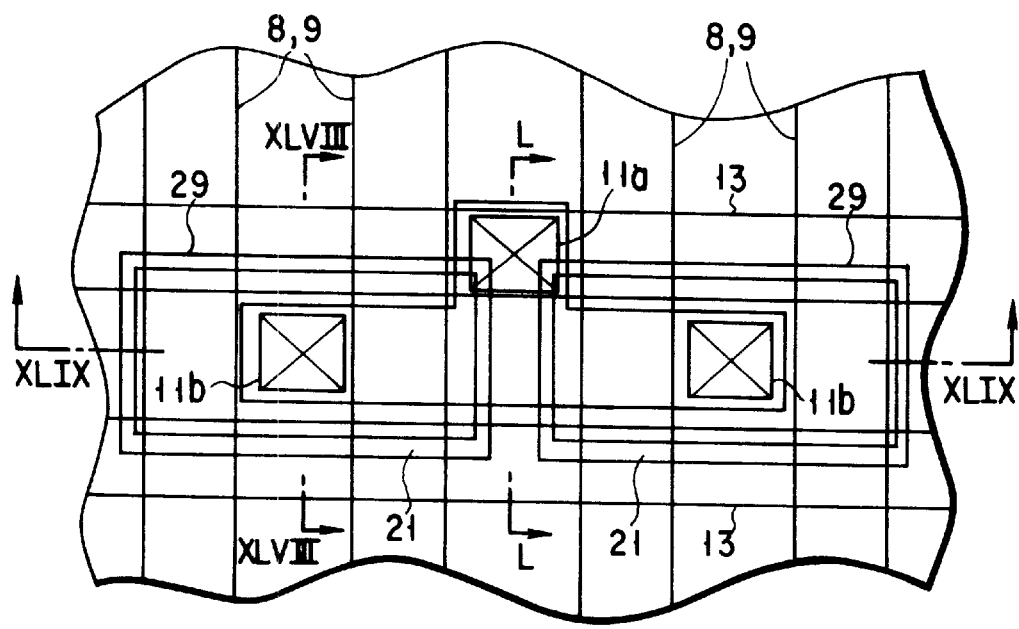
FIG. 47 is a plan view explaining one of the steps of manufacturing a DRAM according to the present invention.
Figure 50:
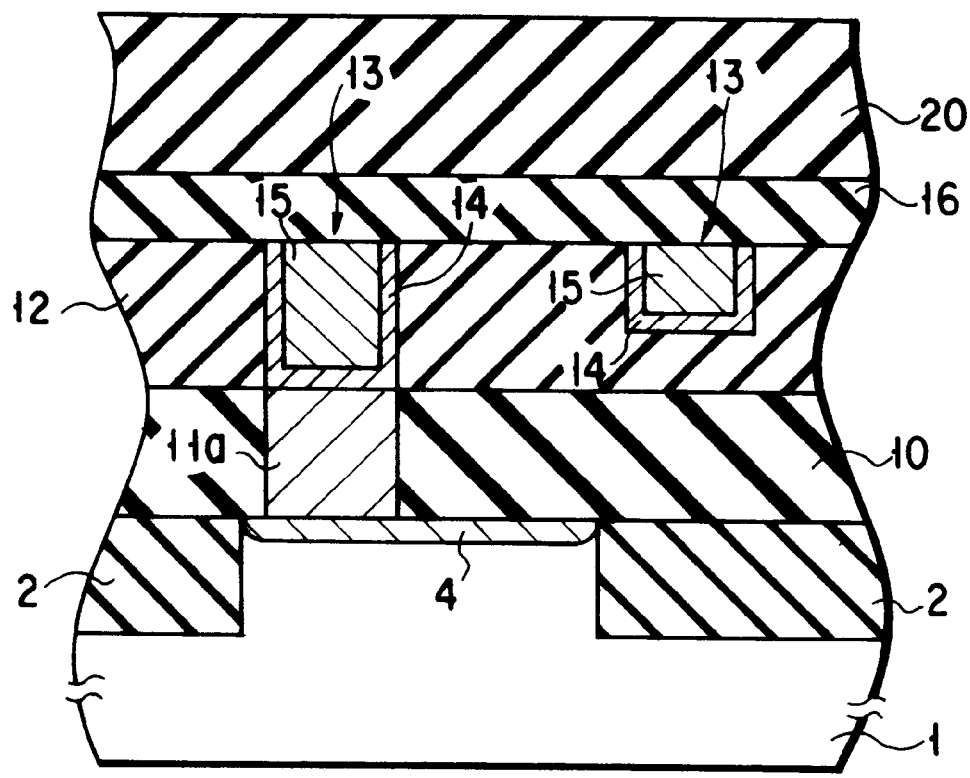
FIG. 50 is a sectional view taken along line L—L in FIG. 47.

FIG. 11 is a plan view illustrating the third embodiment of the capacitor section of the DRAM according to the invention. FIG. 12 is a sectional view taken along line XII—XII in FIG. 11. FIG. 13 is a sectional view taken along line XIII—XIII in FIG. 11. FIG. 14 is a sectional view taken along line XIV—XIV in FIG. 11.

For the sake of simplicity, FIGS. 11 to 14 show only two bit sections (two memory cells) of the DRAM, though the capacitors of many memory cells are arranged in rows and columns, forming a matrix, on the silicon substrate 1 of the DRAM.

The P-type silicon substrate 1 has a trench. An element-isolating film 2 is formed in the trench. The film 2 is an insulating film of the structure known as "shallow trench isolation." The element-isolating film 2 is made of, for example, silicon oxide. A field oxide film formed by LOCOS oxidation may replace the film 2.

The element-isolating film 2 surrounds an element region 3. Two MOS transistors 5 are formed in the element region 3. The MOS transistors 5 share a diffusion layer 4. Each MOS transistor 5 has a diffusion layer 4, a diffusion layer 6, a gate oxide film 7, and a gate electrode.

The gate oxide film 7 is made of, for example, silicon oxide. The gate electrode comprises an n-type poliyilicon layer 8 and a silicide layer 9 provided on the poliyilicon layer 8. The polysilicon layer 8 contains impurities (e.g., phosphorus). The silicide layer 9 is made of, for example, tungsten silicide.

The MOS transistors 5 are covered with an interlayer insulator 10 made of, for example, silicon oxide. The interlayer insulator 10 has a contact hole in that part which is provided on the diffusion layer 4. A contact plug 11a is formed in the contact hole. The interlayer insulator 10 has two other contact holes in those parts which are provided on the diffusion layers 6. Contact plugs 11b are formed in these contact holes, respectively. The contact plugs 11a and 11b are made of, for instance, polysilicon containing impurities.

An interlayer insulator 12 made of, for example, silicon oxide, is formed on the interlayer insulator 10. The interlayer insulator 12 has a trench and a contact hole, in which wires are provided. More specifically, bit lines 13 are formed in the trench and the contact hole. The bit line 13 formed in the contact hole is connected to the contact plug 11a. Both bit lines 13 comprise, for example, a barrier metal layer 14 (Ti layer, TiN layer or the like) and a refractory metal layer 15 (tungsten layer or the like).

An interlayer insulator 16 made of, for example, silicon oxide is provided on the interlayer insulator 12. The interlayer insulators 12 and 16 have contact holes which reach the contact plugs 11b. Contact plugs 17 are formed in these contact holes and are, hence, connected to the contact plugs 11b. The contact plugs 17 comprise a barrier metal layer 18 (Ti layer, TiN layer or the like) and a refractory metal layer 19 (tungsten layer or the like).

An interlayer insulator 20 made of, for example, silicon oxide is provided on the interlayer insulator 16. The interlayer insulator 20 has trenches in those parts which are located above the contact plugs 17. Each of the trenches has sides which are so curved that the interlayer insulator 20 existing between the trenches has a cross section which gradually reduces in width toward its top. The gap between the storage electrodes 23 of two adjacent capacitors 22 is therefore very narrow at the top of the interlayer insulator 20. To isolate the storage electrodes 23 sufficiently, an insulating film 21 (silicon nitride film or the like) is formed on the sides of each trench.

The capacitors 22 are provided in the trenches. Each capacitor 22 comprises a storage electrode 23 (storage node), a capacitor insulating film 24, and a plate electrode 25. The storage electrode 23 is formed on the sides and bottom of the trench and connected to the contact plug 17. The capacitor insulating film 24 is provided on the storage electrode 23. The plate electrode 25 is common to all capacitors 22 provided.

In this DRAM, an insulating film 21 (a silicon nitride film or the like) is formed on the sides of one trench, as mentioned above. In other words, a laminate composed of the interlayer insulator 20 and the insulating film 21 is provided between the storage electrodes of the two adjacent capacitors 22. Namely, the laminate electrically isolates the capacitors 22 from each other.

The insulating films 20 and 21 are made of material and have thickness which are selected on the basis of the size of the trenches and the thickness of the storage electrode 23, the capacitor insulating film 24 and plate electrode 25. Therefore, the capacitors 22 are electrically isolated sufficiently and can function well in DRAMs, though the interval d between them is reduced.

Further, the coverage of the storage electrodes 23, insulating films 24 and plate electrode 25, all formed in the trenches, can be improved since both sides of each trench are curved. For the same reason, the coverage of the interlayer insulator provided on the plate electrode 25 can be improved in the trenches. Voids are hardly formed in the interlayer insulator provided on the plate electrode 25.

Still further, since the sides of each trench are curved, the storage electrode 23 of the capacitor has no corners. Therefore, an electric field will not be concentrated at any part of the storage electrode 23. Hence, a leakage current can be controlled, and insulation breakdown can be prevented.

A method of manufacturing the DRAM of this invention, which has the capacitor section shown in FIGS. 3 to 6, will be explained with reference to FIGS. 15 to 50.

For the sake of simplicity, only two bit sections (two memory cells) of the DRAM are shown in FIGS. 15 to 50.

As shown in FIGS. 15 to 18, a P-type silicon substrate 1 is subjected to thermal oxidation, forming a silicon oxide film 26 on the silicon substrate 1. A silicon nitride film 27 is formed on the silicon oxide film 26 by, for example, LPCVD.

Next, a resist pattern is formed by photolithography. Using the resist pattern as a mask, RIE (Reactive Ion Etching), for example, is performed, etching the silicon nitride film 27, silicon oxide film 26 and silicon substrate 1 in the order mentioned. As a result, an element-isolating trench is made in the silicon substrate 1. Thereafter, the resist pattern is removed.

LPCVD or plasma CVD is carried out, forming a silicon oxide film on the silicon substrate 1 and filling the trench with silicon oxide. CMP (Chemical Mechanical Polishing) is then conducted, polishing the silicon oxide film. An element-isolating film 2 of STI (Shallow Trench Isolation) structure is thereby formed in the trench only. In this process, the silicon nitride film 27 works as an etching stopper in the CMP.

Thereafter, a heated phosphoric acid solution is applied, thereby removing the silicon nitride film 27. Further, an $NH_4F$ solution is applied, thus removing the silicon oxide film 26.

As is shown in FIGS. 19 to 22, thermal oxidation is performed, oxidizing the surface of the silicon substrate 1. A gate oxide film 7 made of silicon oxide is thereby formed. LPCVD is then carried out, forming a polysilicon film 8 containing N-type impurities (e.g., phosphorus), on the gate oxide film 7, a silicide film 9 (e.g., tungsten silicide film) on the polysilicon film 8, and a silicon nitride film 30 on the silicide film 9.

Photolithography is effected, forming a resist pattern. Using the resist pattern as a mask, RIE (Reactive Ion Etching) is conducted, etching the silicon nitride film 30, silicide film 9 and polysilicon film 7 in the order mentioned. A gate electrode (word line) composed of the polysilicon film 7 and silicide film 9 is thereby formed. Thereafter, the resist pattern is removed.

Using gate electrode made up of the silicide film 9 and polysilicon film 7, as a mask, N-type impurities (e.g., phosphorus or arsenic) are introduced into the silicon substrate 1 by ion implantation. The impurities thus introduced are activated by heat treatment. A diffusion layer 4 and diffusion layers 6 are thereby formed in the silicon substrate 1.

A silicon nitride film 31 is formed, covering the gate electrode composed of the silicide film 9 and polysilicon film 7. Then, RIE is carried out, etching the silicon nitride film 31, except those parts which cover the sides of the gate electrode.

Further, a silicon oxide film is formed by LPCVD on the silicon substrate 1, covering the MOS transistors 5. The silicon oxide film is polished, thereby forming an interlayer insulator 10 which has a flat surface. Photolithography and etching are carried out, making in the interlayer insulator 10 a contact hole 32 reaching the diffusion layer 4 and contact holes 33 reaching the diffusion layers 6.

Thereafter, a polysilicon layer containing N-type impurities is formed by LPCVD. The polysilicon layer is etched by CMP or CDE (Chemical Dry Etching), which is one of the isotropic etching methods. As a result, a contact plug (electrode) 11a is formed in the contact hole 32, and contact plugs (electrodes) 11b are formed in the contact holes 33.

Next, LPCVD or plasma CVD is performed, thereby forming an interlayer insulator 12 on the interlayer insulator 10 as is shown in FIGS. 23 to 26. The insulator 12 is made of, for example, silicon oxide. Further, photolithography and etching are conducted, forming a wiring trench 34 in the interlayer insulator 12 and a contact hole 35 in the wiring trench 34. The contact hole 35 thus made reaches the contact plugs 11a.

Then, a barrier metal film 14 (Ti film, TiN film or the like) is formed on the interlayer insulator 12 and in the wring trench 34 and contact hole 35. A refractory metal film 15 (tungsten or the like) is formed by, for example, blanket CVD on the barrier metal film 14. At this time, the wiring trench 34 and the contact hole 35 are filled with the refractory metal. The refractory metal film 15 and the barrier metal film 14 are etched, forming a bit line 13 in the wiring trench 34 and the contact hole 35. (This method of forming the bit line 13 is known as "dual Damascene process."

The bit line 13 may be made of polysilicon or a metal such as aluminum or copper.

Next, an interlayer insulator 16 is formed by, for example, LPCVD or plasma CVD on the interlayer insulator 12 as is illustrated in FIGS. 27 to 30. The insulator 16 is made of, for instance, silicon oxide. Photolithography and etching are conducted, making contact holes 28 in the interlayer insulators 12 and 16. These contact holes 28 reach the contact plugs 11b.

As shown in FIGS. 31 to 34, a barrier metal film 18 (Ti film, TiN film or the like) is formed on the interlayer insulator 16 and the contact holes 28. A refractory metal film 19 (tungsten film or the like) is formed on the barrier metal film 18 by, for example, blanket CVD. The contact holes 28 are thereby filled with the refractory metal.

The refractory film 19 and the barrier metal film 18 are etched by, for example, CMP. Contact plugs 17 are thereby formed in the contact holes 28. The contact plugs 17 are connected to the contact plugs 11b. The contact plugs 17 may be made of polysilicon or a metal such as aluminum or copper.

Then, an interlayer insulator 20 made of, for example, silicon oxide is formed on the interlayer insulator 16 by, for instance, LPCVD or plasma CVD, as is illustrated in FIGS. 35 to 38. Further, photolithography and etching are applied, forming trenches 29 in the interlayer insulator 20. The trenches reach the contact plugs 17.

The sides of each trench 29 may be inclined to 80° or more, but less than 90°, to the surface of the insulator 16, or may be curved, by changing the conditions of etching the interlayer insulator 20. Since the trenches 29 are located right above the contact plugs 17, respectively, they are provided in the same number as the contact plugs 17.

Next, as shown in FIGS. 39 to 42, LPCVD or plasma CVD is conducted, forming insulating film 21 (e.g. silicon nitride film) on the interlayer insulator 20 and on the sides and bottom of each trench 29. The film 21 is etched by RIE, except those parts provided on the sides of each trench 29. The insulating film 21 not only enhances the insulation between the two adjacent capacitors, but also covers the tiny projections and trenches formed on and in the sides of the trench 29 at the time of forming the trench 29, thereby smoothing the sides of the trench 29. The insulating film 21 is made of a material and has a thickness which are selected on the basis of the size of the trench 29, and the thickness of the storage electrode 23, capacitor insulating film 24 and plate electrode 25.

Then, as is illustrated in FIGS. 43 to 46, sputtering or CVD is carried out, forming a conductor made of ruthenium (Ru) or the like on the interlayer insulator 20 and on the sides and bottom of each trench 29. A spin-on-glass (SOG) film is formed in the trenches 29 and on the interlayer insulator 20. The SOG film and the conductor made of ruthenium or the like are polished by CMP. The conductor made of ruthenium or the like remains on the sides and bottom of each trench 29. A storage electrode 23 is thereby formed on the sides and bottom of each trench 29.

In the case where the storage electrodes 23 are made of ruthenium, it is desirable that they may be formed in the following manner. First, the SOG film is left in only the trenches 29 by effecting CMP. Then, RIE is performed in an atmosphere of $O_2$ and $Cl_2$. Finally, those parts of the ruthenium layer existing outside the trenches 29 are removed. In the RIE performed in the atmosphere of $O_2$ and $Cl_2$, the silicon oxide film is etched at a lower rate than the ruthenium layer.

The SOG film used to form the storage electrodes 23 is removed by a applying diluted HF or by conducting gas-phase HF process. The SOG film can be removed, because it is etched at a higher rate than the interlayer insulator 20 (silicon oxide film) underlying the SOG film.

Instead of the above methods, the storage electrodes 23 can be formed by providing a resist in the trenches 29 only and then removing, by RIE, those parts of the ruthenium layer which exist outside the trenches 29.

Next, as shown in FIGS. 47 to 50, sputtering, CVD or the like is applied, thereby forming a capacitor insulating film 24 made of, for instance, BSTO. The capacitor insulating film 24 may be a high-dielectric thin film. If so, the capacitors can acquire sufficient capacitance, without deepening the trenches 29.

Sputtering or CVD is performed, forming a plate electrode 25 made of, for example, ruthenium. The plate electrode 25 is processed by, for example, photolithography or etching. The plate electrode 25 is thereby arranged on a memory cell array only.

Thus, the memory cells of the DRAM are made completely.

In the manufacturing method described above, the insulating film 21 (silicon oxide film or the like) is formed on the sides of each trench 29 formed in the interlayer insulator 20 (silicon oxide film or the like) before the capacitors are formed. That is, a laminate composed of the interlayer insulator 20 and insulating film 21 is provided between the storage electrodes of the two adjacent capacitors. It is the laminate that electrically isolates the capacitors from each other.

As indicated above, the insulating films 20 and 21 are made of materials and have thicknesses, which are selected on the basis of size of the trenches and the thickness of the storage electrodes 23, capacitor insulating films 24 and plate electrode 25. Hence, the capacitors are electrically isolated so as to function fully in the memory cells of a DRAM even if the interval between them is reduced.

According to this invention, the storage electrodes 23 and the plate electrode 25 can be made of at least one material selected from a first metal group consisting of Ru, Pt, Re, Os, Rh, Ir and Sr, from a second metal group consisting of an oxide of any metal of the first metal group, any alloy containing any metal of the first metal group and an oxide of the alloy, W, Nb, Al, Ti and Ta, and from a third metal group consisting of any nitride of any metal of the second metal group, Mo, Cu, and Pb.

According to the present invention, the capacitor insulating film 24 is made of at least one material selected from the group consisting of $(Ba, Sr)TiO_3$, $BaTiO_3$, $SrTiO_3$, $PbZrO_3$, $LiNbO_3$, $Bi_4Ti_3O_{12}$, and $Ta_2O_5$.

As has been described above, an insulating film (silicon nitride film) is provided on the sides of each capacitor trench made in the interlayer insulator of the capacitor section of the DRAM according to this invention. Therefore, the capacitors are electrically isolated sufficiently to function well in the DRAM even if the interval between them is reduced.

Additional advantages and modifications will readily occur to those skilled in the art. Therefore, the invention in its broader aspects is not limited to the specific details and representative embodiments shown and described herein. Accordingly, various modifications may be made without departing from the spirit or scope of the general inventive concept as defined by the appended claims and their equivalents.

What is claimed is:

1. A semiconductor device comprising:
   a first insulating film having a contact hole;
   a second insulating film contacting the first insulating film and having a trench which is located on the contact hole;
   a third insulating film contacting an upper surface of the first insulating film and located on a side of the trench of the second insulating film;
   a first electrode located in the trench of the second insulating film, the third insulating film being located between the first electrode and the second insulating film;
   a fourth insulating film located on the first electrode; and
   a second electrode located on the fourth insulating film.

2. A semiconductor device according to claim 1, wherein said second insulating film is a silicon oxide film, and said third insulating film is a silicon nitride film.

3. A semiconductor device according to claim 1, wherein the side of the trench of said second insulating film is inclined to the bottom of the trench at an angle of 80° to less than 90°.

4. A semiconductor device according to claim 1, wherein the side of the trench of said second insulating film has a curved surface.

5. A semiconductor device according to claim 1, further comprising a contact plug filled with the contact hole.

6. A semiconductor device according to claim 1, wherein a size of the trench is greater than a size of the contact hole.

7. A semiconductor device according to claim 1, wherein the first electrode is in contact with the first insulating film.

8. A semiconductor device according to claim 1, wherein the third insulating film is only located on the side of the trench of the second insulating film.

9. A semiconductor device comprising:
   a first insulating film having a first depression and a second depression;
   a second insulating film contacting the first insulating film and located on a side of the first depression;
   a third insulating film contacting the first insulating film and located on a side of the second depression;
   a first electrode located in the first depression, the second insulating film being located between the first electrode and the first insulating film;
   a second electrode located in the second depression, the third insulating film being located between the second electrode and the first insulating film;
   a fourth insulating film located on the first electrode;
   a fifth insulating film located on the second electrode;
   a third electrode located on the fourth insulating film; and
   a fourth electrode located on the fifth insulating film;
   wherein a size of the first depression is greater than a width between the first and second depressions, and a size of the second depression is greater than a width between the first and second depressions.

10. A semiconductor device according to claim 9, wherein said first insulating film is a silicon oxide film, and said second and third insulating films are silicon nitride films.

11. A semiconductor device according to claim 9, wherein said first electrode, said fourth insulating film, and said third electrode constitute a first capacitor of a first memory cell of a dynamic random-access memory, and said second electrode, said fourth insulating film, and said third electrode constitute a second capacitor of a second memory cell of said dynamic random-access memory.

12. A semiconductor device according to claim 9, wherein said first and second electrodes are electrically isolated by said first insulating film, said second insulating film, and said third insulating film.

13. A semiconductor device according to claim 9, wherein said first insulating film, said second insulating film, and said third insulating film are located between said first and second electrodes.

14. A semiconductor device according to claim 9, wherein said first electrode, said second electrode, and said third electrode include one material selected from a first metal, a second metal, and a third metal, said first metal being a material selected from a first metal group consisting of Ru, Pt, Re, Os, Rh, Ir and Sr, said second metal being a material selected from a second metal group consisting of an oxide of any metal of the first metal group, any alloy containing any metal of the first metal group and an oxide of the alloy, W, Nb, Al, Ti and Ta, and said third metal being a material selected from a third metal group consisting of any nitride of any metal of the second metal group, Mo, Cu, and Pb.

15. A semiconductor device according to claim 9, wherein said fourth insulating film is made of at least one material selected from the group consisting of (Ba, Sr)TiO$_3$, BaTiO$_3$, SrTiO$_3$, PbZrO$_3$, LiNbO$_3$, Bi$_4$Ti$_3$O$_{12}$, and Ta$_2$O$_5$.

16. A semiconductor device according to claim 9, wherein the sides of the first and second depressions are inclined to bottoms of the first and second depressions at an angle of 80° to less than 90°.

17. A semiconductor device according to claim 9, wherein the sides of the first and second depressions have a curved surface.

18. A semiconductor device according to claim 9, further comprising:
   a semiconductor substrate;
   a first transistor having a source region and provided on said semiconductor substrates, said first electrode being electrically connected to the source region of said first transistor; and
   a second transistor having a source region and provided on said semiconductor substrate, said second electrode being electrically connected to the source region of said second transistor.

19. A semiconductor device according to claim 18, further comprising
   a bit line electrically connected to drain regions of the first and second transistors.

20. A semiconductor device according to claim 9, wherein the fourth and fifth insulating films are made of the same material, and the third and fourth electrodes are made of the same material.

21. A semiconductor device comprising:
   a first insulating film having a first contact plug and a second contact plug;
   a second insulating film having a first trench which is located on the first contact plug and a second trench which is located on the second contact plug;
   a third insulating film contacting the second insulating film and located on a side of the first trench of the second insulating film;
   a first electrode located in the first trench of the second insulating film, the third insulating film being located between the first electrode and the second insulating film;
   a fourth insulating film located on the first electrode;
   a second electrode located on the fourth insulating film;
   a fifth insulating film located on a side of the second trench; and
   a third electrode located on the second trench, wherein the fifth insulating film is located between the third electrode and the second insulating film, the fourth insulating film is located on the third electrode, and the second electrode is located on the fourth insulating film.

22. A semiconductor device according to claim 21, wherein said second insulating film is a silicon oxide film, said third insulating film is a silicon nitride film, and said fifth insulating film is a silicon nitride film.

23. A semiconductor device according to claim 21, wherein said first electrode and said third electrode are electrically isolated by said second insulating film, said third insulating film, and said fifth insulating film.

24. A semiconductor device according to claim 21, wherein the sides of the first and second trenches are inclined to bottoms of the first and second trenches at an angle of 80° to less than 90°.

25. A semiconductor device according to claim 21, wherein the sides of the first and second trenches have a curved surface.

26. A semiconductor device comprising:
   a first insulating film having a first contact hole and a second contact hole;
   a second insulating film having a first trench which is located on the first contact hole and a second trench which is located on the second contact hole;
   a third insulating film contacting the second insulating film and located on a side of the first trench of the second insulating film;

a fourth insulating film contacting the second insulating film and located on a side of the second trench of the second insulating film;

a first electrode located in the first trench of the second insulating film, said first electrode being provided along a bottom face and an inner wall of the first trench, and the third insulating film being located between the first electrode and the second insulating film;

a second electrode located in the second trench of the second insulating film, said second electrode being provided along the bottom face and the inner wall of the first trench, and the fourth insulating film being located between the second electrode and the second insulating film;

a fifth insulating film located on the first and second electrodes; and a third electrode located on the fifth insulating film.

27. A semiconductor device according to claim 26, wherein said second insulating film is a silicon oxide film, said third insulating film is a silicon nitride film, and said fourth insulating film is a silicon nitride film.

28. A semiconductor device according to claim 26, wherein said first electrode and said second electrode are electrically isolated by said second insulating film, said third insulating film, and said fourth insulating film.

29. A semiconductor device according to claim 26, wherein the sides of the first and second trenches are inclined to bottoms of the first and second trenches at an angle of 80° to less than 90°.

30. A semiconductor device according to claim 26, wherein the sides of the first and second trenches have a curved surface.

31. A semiconductor device comprising:

a first insulating film having a contact hole;

a second insulating film contacting the first insulating film and having a trench which is located on the contact hole;

a third insulating film contacting the first insulating film and being located on a side of the trench of the second insulating film;

a first electrode contacting the first insulating film and located in the trench of the second insulating film, the third insulating film being located between the first electrode and the second insulating film;

a fourth insulating film located on the first electrode; and a second electrode located on the fourth insulating film.

32. A semiconductor device according to claim 30, wherein the second insulating film is a silicon oxide film and the third insulating film is a silicon nitride film.

33. A semiconductor device according to claim 30, wherein the side of the trench of the second insulating film is inclined to a bottom of the trench at an angle of 80° and less than 90°.

* * * * *

UNITED STATES PATENT AND TRADEMARK OFFICE
CERTIFICATE OF CORRECTION

PATENT NO. : 6,150,690
DATED : November 21, 2000
INVENTOR(S) : Yutaka Ishibashi et al.

It is certified that error appears in the above-identified patent and that said Letters Patent is hereby corrected as shown below:

Claim 18, column 14,
Line 5, "substrates" has been deleted and in its place -- substrate -- has been inserted.

Claim 32, column 16,
Line 21, "30" has been deleted and in its place -- 31 -- has been inserted.

Claim 33, column 16,
Line 24, "30" has been deleted and in its place -- 31 -- has been inserted.

Signed and Sealed this

Twenty-fifth Day of September, 2001

Attest:

Nicholas P. Godici

NICHOLAS P. GODICI
*Acting Director of the United States Patent and Trademark Office*

*Attesting Officer*